(12) United States Patent
Reisinger et al.

(10) Patent No.: US 7,570,345 B2
(45) Date of Patent: Aug. 4, 2009

(54) METHOD OF OPTIMIZING IMAGING PERFORMANCE

(75) Inventors: Gerd Reisinger, Oberkochen (DE); Manfred Maul, Aalen (DE); Paul Graeupner, Aalen (DE); Martin Schriever, Aalen (DE); Ulrich Wegmann, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/808,316

(22) Filed: Jun. 8, 2007

(65) Prior Publication Data
US 2008/0007706 A1 Jan. 10, 2008

Related U.S. Application Data

(62) Division of application No. 11/102,835, filed on Apr. 11, 2005, now Pat. No. 7,233,386.

(60) Provisional application No. 60/560,623, filed on Apr. 9, 2004.

(51) Int. Cl.
G03B 27/54 (2006.01)
G03B 27/42 (2006.01)

(52) U.S. Cl. .......................... 355/67; 355/53
(58) Field of Classification Search .................. 355/52, 355/53, 55, 67, 77; 250/548; 430/311
See application file for complete search history.

(56) References Cited

U.S. PATENT DOCUMENTS

| | | | |
|---|---|---|---|
| 4,690,528 A | 9/1987 | Tanimoto et al. | |
| 4,871,237 A | 10/1989 | Anzai et al. | |
| 4,961,001 A | 10/1990 | Liegel et al. | |
| 5,229,872 A | 7/1993 | Mumola | |
| 5,296,891 A | 3/1994 | Vogt et al. | |
| 5,337,097 A | 8/1994 | Suzuki et al. | |
| 5,392,119 A | 2/1995 | McArthur et al. | |
| 5,436,692 A | 7/1995 | Noguchi | |
| 5,523,193 A | 6/1996 | Nelson | |

(Continued)

FOREIGN PATENT DOCUMENTS

DE 37 33 823 4/1989

(Continued)

OTHER PUBLICATIONS

J.R.L, "Software uses lens aberrations to enhance images", Solid State Technology, May 2004, www.solid-state.com, p. 20.

*Primary Examiner*—Hung Henry Nguyen
(74) *Attorney, Agent, or Firm*—Townsend and Townsend and Crew LLP

(57) ABSTRACT

A method of optimizing an imaging performance of a projection exposure system is provided, wherein the projection exposure system includes an illumination optical system for illuminating a patterning structure and a projection optical system for imaging a region of the illuminated patterning structure onto a corresponding field. The method involves setting the field to a first exposure field, setting optical parameters of the projection exposure system to a first setting such that the imaging performance within the first exposure field is a first optimum performance, changing the field to a second exposure field, and changing the optical parameters to a second setting such that the imaging performance within the second exposure field is a second optimum performance.

4 Claims, 10 Drawing Sheets

U.S. PATENT DOCUMENTS

| | | | |
|---|---|---|---|
| 5,710,620 A | 1/1998 | Taniguchi | |
| 5,739,899 A | 4/1998 | Nishi et al. | |
| 5,828,455 A | 10/1998 | Smith et al. | |
| 5,973,863 A | 10/1999 | Hatasawa et al. | |
| 5,978,085 A | 11/1999 | Smith et al. | |
| 6,014,455 A | 1/2000 | Sumiyoshi et al. | |
| 6,072,561 A | 6/2000 | Sakakibara | |
| 6,078,380 A | 6/2000 | Taniguchi et al. | |
| 6,256,086 B1 | 7/2001 | Sumiyoshi | |
| 6,285,443 B1 | 9/2001 | Wrangler et al. | |
| 6,304,317 B1 | 10/2001 | Taniguchi et al. | |
| 6,307,688 B1 | 10/2001 | Merz et al. | |
| 6,331,368 B2 | 12/2001 | Dirksen et al. | |
| 6,388,823 B1 | 5/2002 | Gaber et al. | |
| 6,411,364 B1 | 6/2002 | Suzuki | |
| 6,411,368 B1 | 6/2002 | Matsumoto et al. | |
| 6,449,031 B1 | 9/2002 | Grodnensky et al. | |
| 6,930,754 B1 | 8/2005 | Sugita et al. | |
| 7,075,651 B2 | 7/2006 | Tsukakoshi | |
| 7,233,386 B2 * | 6/2007 | Reisinger et al. | 355/55 |
| 2002/0001088 A1 | 1/2002 | Wegmann et al. | |
| 2002/0048096 A1 | 4/2002 | Melzer et al. | |
| 2002/0159048 A1 | 10/2002 | Inoue et al. | |
| 2003/0002023 A1 | 1/2003 | von Bünau et al. | |
| 2003/0063268 A1 | 4/2003 | Kneer et al. | |
| 2003/0071986 A1 | 4/2003 | Geh et al. | |
| 2003/0137654 A1 | 7/2003 | Mizuno | |
| 2004/0059444 A1 | 3/2004 | Tsukakoshi | |
| 2004/0090606 A1 | 5/2004 | Ishikawa | |
| 2004/0257683 A1 | 12/2004 | Petasch et al. | |
| 2004/0263817 A1 * | 12/2004 | Tanitsu et al. | 355/67 |

FOREIGN PATENT DOCUMENTS

| | | |
|---|---|---|
| DE | 198 27 603 | 12/1999 |
| DE | 101 09 929 | 11/2001 |
| DE | 100 46 379 | 3/2002 |
| DE | 101 20 446 | 4/2003 |
| DE | 101 51 919 | 5/2003 |
| DE | 101 43 385 | 7/2003 |
| EP | 0 992 853 | 4/2000 |
| EP | 1 296 191 | 3/2003 |
| JP | 08234138 | 9/1996 |
| WO | WO 02/050506 | 6/2002 |
| WO | WO 02/052620 | 7/2002 |
| WO | WO 02/054036 | 7/2002 |
| WO | WO 02/063664 | 8/2002 |

* cited by examiner

METHOD OF OPTIMIZING IMAGING PERFORMANCE

This application is a divisional of U.S. patent application Ser. No. 11/102,835 filed on Apr. 11, 2005 which is now U.S. Pat. No. 7,233,386, which claims the benefit under 35 U.S.C. 119(e) of U.S. Provisional Patent Application No. 60/560,623 filed on Apr. 9, 2004, the entire contents of each of which are incorporated herein by reference.

BACKGROUND

1. Field of the Invention

The present invention generally relates to a method of optimizing an imaging performance of a projection exposure system and a projection exposure system adapted to carry out the method.

2. Brief Description of Related Art

Lithographic processes are commonly used in the manufacture of semiconductor elements, such as integrated circuits (ICs), LSIs, liquid crystal elements, micropatterned members and micromechanical components.

A projection exposure apparatus used for photolithography generally comprises an illumination optical system with a light source and a projection optical system. Light from the illumination optical system illuminates a reticle (mask) having a given pattern and the projection optical system transfers an image of the reticle pattern onto a photo-sensitive substrate. The image of the reticle pattern may also be reduced in size by the projection optical system so as to produce a smaller image of the reticle pattern on the substrate.

The trend towards ever more sophisticated semiconductor devices requires semiconductor elements of smaller size and higher complexity which, in turn, makes higher demands on an imaging performance achievable with projection exposure systems. In particular, the image of the reticle pattern needs to be very accurately projected onto the substrate. Therefore, for instance, aberrations of the wave-fronts of the light transferring the image of the reticle pattern onto the substrate need to be reduced to the greatest extent possible. Also other factors, such as transmission properties, evenness and efficiency of illumination as well as polarization effects need to be closely controlled.

In addition, efforts are being made to increase the throughput of exposures such as to decrease the overall manufacturing time and thus manufacturing costs. The efficiency of the lithographic process therefore needs to be optimized.

Various methods and systems are known which allow to alter the imaging performance of the projection exposure systems after assembly of the various components comprised in the projection exposure system. For instance, one or more lenses can be tilted or moved perpendicular to or along an optical axis of the system to reduce certain types of aberrations, such as astigmatism.

Generally, a projection exposure system is optimized after assembly to provide optimum performance.

However, after assembly and optimization, the imaging performance of a projection exposure system may undergo a change induced by a variation in atmospheric conditions of the environment the projection exposure system is exposed to, for example. Transport of the assembled projection exposure system may also cause mechanical changes affecting a quality of a projection exposure. The imaging performance of the projection exposure system may also change over time due to damage to optical elements induced by extended exposure to radiation and resulting change in aberrations, transmittance and/or reflectance, for instance. In addition, a change of a mode of illumination, for instance off-axis illumination or multipole illumination modes, may require imaging characteristics to be adapted.

Given the ever increasing demands on imaging performance and efficiency, there remains a need for a method of optimizing an imaging performance of a projection optical system and projection exposure systems adapted to carry out the method.

SUMMARY OF THE INVENTION

In view of the above, it is an object of the present invention to provide a method of optimizing an imaging performance of a projection exposure system. It is also an object of the present invention to provide a projection exposure system adapted to carry out the method of optimizing an imaging performance. It is a further object of the present invention to provide a projection exposure system having an illumination system for efficiently illuminating regions of different size of a reticle.

In a first aspect, a method of optimizing an imaging performance of a projection exposure system is provided. The projection exposure system comprises an illumination optical system including a light source for illuminating a patterning structure and a projection optical system for imaging a region of the illuminated patterning structure onto a corresponding field in a substrate plane. The method comprises setting the field to a first exposure field, the first exposure field having first field dimensions and a first position within a maximum field exposable by the projection exposure system, and setting optical parameters of the projection exposure system, for instance in particular the projection optical system, to a first setting such that the imaging performance within the first exposure field is a first substantially optimum performance.

The method also comprises changing the field to a second exposure field, the second exposure field having second field dimensions different from the first field dimensions or/and a second position within the maximum field exposable by the projection exposure system, which second position is different from the first position. The method also comprises changing the optical parameters of the projection exposure system, for instance in particular the projection optical system, to a second setting such that the imaging performance within the second exposure field is a second substantially optimum performance. The imaging performance within the second exposure field in the second setting is better than an imaging performance within the second exposure field in the first setting.

Generally, an imaging performance of a projection exposure system is adapted and optimized for a maximum field exposable by the projection exposure system, i.e. a largest possible field size, following assembly of the projection exposure system. The maximum field exposable by the projection exposure system (also referred to as "maximum exposable field" in the following) in a mode adapted to carry out exposures in a lithographic process generally corresponds to what is referred to as the "field of view" and describes an area in a substrate-plane that can be exposed by the projection exposure system (usually in an exposure step).

It has been found, however, that it is advantageous to optimize an imaging performance of a projection exposure system with respect to the actual field used for exposure in a particular application, with the exposure field being defined by field dimensions or/and a position within the maximum exposable field. Different applications may require different fields in terms of dimensions. In addition, it has been found that a distribution of aberrations across the maximum exposable field can be used advantageously for optimizing an imaging performance by selecting a favorable position for the exposure field within the maximum exposable field in order to provide a substantially optimum performance.

It will be appreciated that determining what constitutes a substantially optimum imaging performance can be determined by one of ordinary skill in the art depending upon, for example, the imaging requirements for the need at hand. As further explained herein, a substantially optimum imaging performance can be a level of imaging performance that permits imaging features at a predetermined quality level over a given field, such as, for example, a quality level sufficient for a subsequent production process. Such a predetermined quality level for imaging features may include, for example, a requirement on feature resolution (e.g., minimum feature size requirement), a maximum allowable registration error between superimposed patterns, a maximum allowable measure of an aberration, or any other suitable quality measure or combination of quality measures. A substantially optimum imaging performance can also be a level of performance that minimizes a given imaging characteristic (e.g., an aberration) or measure thereof over a given field or that maximizes a given imaging characteristic (e.g., resolution) or measure thereof over a given field.

When changing at least one of dimensions and position of the first field from a first exposure field with a given first setting of optical parameters to a second exposure field having at least one of different dimensions and position, at least one optical parameter of the projection exposure system is changed, resulting in a second setting of optical parameters, such that a better imaging performance results as compared to a use of the first setting of optical parameters for exposure of the second exposure field having the at least one of second field dimensions and position.

At least one optical parameter of the projection exposure system, and in particular the projection optical system for instance, is adjusted to obtain optimum imaging performance for an individual field having field dimensions and position when the at least one of field dimensions and position are changed.

The change of field may be associated with a change of reticle or a change of the region of the reticle to be imaged. Most preferably, after adjusting optical parameters to the respective setting, exposures of substrates are carried out in order to produce miniaturized articles from the exposed substrates before the field is set to another exposure field and optical parameters are changed for another setting.

In a second aspect, a method of optimizing an imaging performance of a projection exposure system is provided. The projection exposure system comprises an illumination optical system including a light source for illuminating a patterning structure, and a projection optical system for imaging a region of the illuminated patterning structure onto a corresponding field in a substrate-plane, which region comprises a first sub-region, wherein the first sub-region of the patterning structure is imaged onto a corresponding first sub-field within the corresponding field in the substrate-plane. The method comprises setting the field to an exposure field, the exposure field having field dimensions and the first sub-field having first sub-field dimensions and a first sub-field position within the exposure field, wherein the first sub-field dimensions are different from the field dimensions. The method also comprises setting optical parameters of the projection exposure system, for instance in particular the projection optical system, to a setting such that the imaging performance within the first sub-field is a substantially optimum performance with regard to a first imaging characteristic and such that the imaging performance with regard to the first imaging characteristic is better within the first sub-field than within an area within the exposure field which is situated outside of the first sub-field.

In preferred embodiments, the first sub-region of the patterning structure comprises features of a first type, wherein the substantially optimum performance with regard to the first imaging characteristic within the first sub-field is necessary to image the features of the first type in a quality sufficient for a subsequent production process.

In the method of optimizing an imaging performance according to the second aspect, preferably the patterning structure further comprises a second sub-region, wherein the second sub-region is imaged onto a corresponding second sub-field within the corresponding field in the substrate-plane, the second sub-field having second sub-field dimensions and a second sub-field position which is different from the first sub-field position within the exposure field; wherein the setting is also such that the imaging performance within the second sub-field is a substantially optimum performance with regard to a second imaging characteristic different from the first imaging characteristic and that the imaging performance with regard to the second imaging characteristic is better within the second sub-field than within an area within the first exposure field which is situated outside of the second sub-field.

Preferably, in those embodiments, the second sub-region of the patterning structure comprises features of a second type, wherein the substantially optimum performance with regard to the second imaging characteristic within the second sub-field is necessary to image the features of the second type in a quality sufficient for a subsequent production process.

In other words, an imaging performance is optimized for a sub-field within the actual exposure field in a given application. The dimensions and/or position of the sub-field within the exposure field are generally determined by corresponding dimensions and/or position of a sub-region within the region of the illuminated patterning structure that is imaged onto the exposure field in the substrate-plane. Dimensions and position of the sub-region of the patterning structure may be spatially defined by the presence of features of a certain type within the region of the patterning structure to be imaged. One type of features of a patterning structure may be more sensitive to one kind of aberration than to another. In other words, a quality of an image of a particular feature on the substrate may be more dependent on one kind of aberration in the projection exposure system than on another. Thus, a first type of features may be sensitive to one kind of aberration, while a second type of features is sensitive to a second kind of aberration.

Optimizing an imaging performance with respect to at least one imaging characteristic in a sub-field is particularly advantageous if this optimization enables to produce images of a region of a patterning structure that have a quality high enough for subsequent production of miniaturized articles from the exposed substrates, in particular when an imaging performance optimized for the entire exposure field would not have been sufficient for this purpose. This second aspect of the present invention is also particularly advantageous if two types of features exist and optimization is carried out with regard to different kinds of aberrations in dependence of the feature-type in the respective sub-region.

The term "patterning structure" as used herein refers broadly to any means suited for endowing an illuminating light beam with a patterned cross-section, an image of which pattern (of the illuminated patterning structure) is projected onto the substrate. The patterning structure may be a mask or a reticle, for example. The term "reticle" is more generally associated with a mask a reduced image of which is projected onto the substrate, and the term "mask" generally refers to a non-reducing, i.e. 1:1 projection exposure. Mask or reticle types include binary, attenuating and alternating phase shift types, and various hybrid types. The mask/reticle may transmit or reflect the illumination light beam whilst imparting a patterned cross-section upon it. Programmable mirror arrays are further examples of patterning structures suitable for use with the present invention. One example of such an array is described, for instance, in U.S. Pat. No. 5,296,891, the entire contents of which is incorporated by reference herein. An active, matrix-addressable surface light modulator is provided with a reflective surface whose individually addressed surface areas reflect incident light as diffracted light and whose non-addressed surface areas reflect light as undiffracted light. Undiffracted light is then filtered out and only the diffracted light permitted to pass to a projection lens (projection optical system). Thus, the matrix-addressable surface matrix is programmed to impart a desired pattern to the illumination light beam. An additional example of a programmable mirror array is disclosed in U.S. Pat. No. 5,523,193, the entire contents of which is incorporated by reference herein. Illumination light strikes a spatial light modulator comprising a plurality of programmable mirror devices or pixels, which are electronically actuated to a defined position thus creating a pattern from which the illumination light beam is reflected towards the substrate or projection optical system, respectively or into an off position. Programmable LCD arrays are further examples of patterning structures suitable for use with the present invention. Such an array is disclosed in U.S. Pat. No. 5,229,872, for instance, the entire contents of which is incorporated by reference herein. An illumination light beam is reflected from a face of a liquid crystal light valve having a reflective pattern of an image (reproduced from a cathode ray tube screen) and is directed through a projection optical system towards a substrate. Generally, light valves or illumination templates are additional terms used in connection with patterning structures.

Generally, a predetermined region of the patterning structure is illuminated by the illumination optical system. An image of the illuminated region of the patterning structure is then projected through the projection optical system onto an exposure field in the substrate-plane. As used herein, the term exposure field refers to the illuminated area on the substrate or in the substrate-plane, respectively. The illuminated area on the substrate, or the exposure field, is thus generally determined by the illuminated region on the patterning structure wherein an image of the region on the patterning structure may be projected onto the substrate (substrate-plane) such that a reduced projection of the illuminated patterning structure is generated on the substrate. Whilst generally, a region of the patterning structure to be illuminated and thus the exposure field is set in the illumination optical system or in between the illumination optical system and the patterning structure, the present invention is not limited to such embodiments.

The field dimensions of the exposure field or sub-field, respectively, indicate the characteristic dimensions of the field, such as a width and a length in case of a rectangular exposure field. The field dimensions thus also characterize a field size.

The position of a field may be given by means of indicating one or more coordinates of one or more characteristic points, for instance two corners of a rectangle together with the dimensions, or by any other convenient means which will be readily apparent to the person skilled in the art. An optical axis which generally intersects a central point of the maximum field exposable by the projection exposure system, for instance, would be a suitable reference point.

Setting or changing field dimensions or/and position of an exposure field within the maximum field exposable by the projection exposure system, respectively, may be accomplished by a number of methods and/or means known to the person skilled in the art. In one preferred embodiment of the present invention, field dimensions are set by a reticle-masking system as described in U.S. Pat. No. 6,285,443, the entire contents of which is incorporated herein by reference. The reticle-masking system defines an adjustable field diaphragm. The reticle-masking system in the patent referred to is used in a scanning-type projection exposure system and allows to illuminate a narrow strip of the reticle only, with the narrow strip being a rectangle having an aspect ratio of 1:2 to 1:8. Other shapes of illuminated regions on the reticle may also be realized.

Alternatively, other means such as a variable illumination field stop or mask or reticle blinds, as disclosed, for instance in U.S. Pat. No. 6,072,561 and U.S. Pat. No. 5,710,620 may be used to set or, respectively, change the field size or field dimensions, respectively.

In other exemplary embodiments of the present invention, field dimension or field size setting means may comprise a view field diaphragm for defining a region on the reticle. Such a view field diaphragm is positioned at a distance from the reticle, for instance in a plane conjugate with the mask, as disclosed, for instance, in U.S. Pat. No. 6,411,364 and reference cited therein, the entire contents of which are incorporated herein by reference.

The above or similar systems may also be applied to patterning structures other than reticles.

The projection exposure system, and in particular the projection optical system, typically has an optical axis. In some embodiments of the present invention, the position of the exposure field may be advantageously selected so as not to encompass the optical axis (off-axis field). Worded differently, the optical axis of the projection exposure system intersects the substrate-plane outside of the exposure field. In the method according to the first aspect of the present invention, both or just one of the first and second exposure field may be such an off-axis field.

If the field is set to an off-axis (exposure) field, moving the illumination system in parts or its entirety may be necessary to provide illumination for a such positioned exposure field.

Preferably, the imaging performance within the first and second exposure fields is determined in dependence of at least one imaging characteristic at a plurality of positions within the respective exposure field. Likewise, in the present invention according to the second aspect, preferably the imaging performance within the respective sub-field is determined in dependence of the respective imaging characteristic at a plurality of positions within the respective sub-field.

Preferably, the imaging characteristic is selected from the group comprising aberration, uniformity, illumination efficiency, telecentricity, transmission and polarization. In the present invention according to both the first and second aspect, the imaging performance is determined with respect to at least one imaging characteristic.

Aberrations comprise chromatic and monochromatic aberrations, with the monochromatic aberrations comprising spherical aberration, coma, and astigmatism as well as longitudinal focus displacement or field curvature and distortion. Furthermore, aberrations of a given type, for instance, astigmatism, often comprise different "components" which are mathematically expressed as terms of different order of wavefront-deformation in the pupil or as different Zernike functions. For one component of a given aberration, different classes can be defined, based on the symmetry of the distribution in the image-field.

In the broader sense, aberrations comprise all kinds of imaging errors, caused by the optical projection system, or other numerical values which characterize the imaging performance or an optical quality, respectively, of a system. Imaging errors are discrepancies between the projected image of a pattern and an ideal image of the pattern. For a given pattern and given illumination conditions and a given system, the imaging errors can be simulated if the aberrations of the system in the narrow sense are known. An example for "other numerical values" (characterizing the imaging performance) is the root mean square of a wavefront, the so called wavefront-RMS.

Uniformity, as used herein, refers to uniformity of illumination in the respective exposure field, i.e. a uniform intensity of illumination over a given exposure field. Uniformity can also relate to uniformity of illumination across a predetermined area which is smaller than the whole field. Illumination efficiency is a measure for the amount of the original illumination intensity, i.e. the illumination intensity generated by the light source (and amplification means, if applicable) that is actually used for exposure in the exposure field of a given field size relative to the original illumination intensity. When defining a region on the patterning structure and thus defining an exposure field which is smaller than a maximum field exposable by the projection exposure system, the exposure field is conventionally defined in such a way (as described above) that a portion of the light generated in the illumination optical system is blocked out by an aperture, i.e. "discarded", resulting in less than optimum illumination efficiency. Specifically, illumination efficiency is used herein to specify the ratio of light intensity generated by the light source (and amplification means, if applicable) to a light intensity that is blocked out as a result of field size setting means in the projection exposure system, which comprises field diaphragms and the like, and, in particular, the illumination optical system and thus not used to illuminate the exposure field.

Transmission, as used herein, is to be understood as a property of the projection exposure system and optical elements thereof to transmit light. The transmission of an optical element may be constant or adjustable or may vary across a region of the optical element.

Polarization, as used herein, refers to the polarization of light passing through optical members in between the light source and the photosensitive substrate in the projection exposure system. Light used in the projection exposure system may be polarized or unpolarized. However, even in projection exposure systems based on exposure using unpolarized light the illumination light may be polarized by one or more optical elements in the projection exposure system. Different reflection or transmission coefficients of high-reflection (HR)-coatings or anti-reflection (AR)-coatings for s- and p-polarized light may introduce partial polarization. S- and p-polarized light may interact differently with the (photosensitive) substrate, which would be detrimental to the quality of the exposure of the substrate.

Projection exposure systems are generally based on a telecentric optical system at least on the substrate side of the projection exposure system. Telecentric optical systems are characterized by the chief rays being collimated for all points across the object and/or image and can be further characterized in that the chief rays are parallel to the optical axis.

Telecentricity is associated with the advantage that an uneven surface of the substrate does not adversely affect an imaging performance since the magnification is generally constant over a range of working distances. However, embodiments of the present invention are not limited to telecentric projection exposure systems.

For instance, an imaging performance is optimized for given (sub-) field dimensions or/and position by adjusting one or more imaging characteristics. Optimizing an imaging characteristic may involve keeping an absolute value of the imaging characteristic or a parameter indicative of the imaging characteristic below a certain threshold value and/or keeping a deviation of a value of the imaging characteristic below a certain threshold value and/or keeping an absolute difference of values of an imaging characteristic at different points in the field below a certain threshold value, for instance. Whilst, as an example, in a first field a value of an imaging characteristic is set to fall below a certain threshold value, upon changing the field size to a smaller size, the highest absolute value is no longer located within the field size and thus, the imaging characteristic may be optimized with regard to different criteria, for instance a minimum deviation of the values of the imaging characteristic from an average value of the imaging characteristic. An example of a method of optimizing an image performance is given in US Patent Application 2003/071986 A1, the entire contents of which are incorporated herein by reference.

One common method to optimize an imaging performance with regard to aberrations is to use a so-called "least square optimization", which aims to minimize a root mean square value of an aberration over the exposure field (field-RMS). If the exposure field comprises N image-points $P_i$ and the aberration to be optimized at $P_i$ has the value $a_i$, then a merit function can be described as $$F = \frac{1}{N}\sqrt{\sum_{i=1}^{N} a_i^2}$$

The least square optimization minimizes this merit function.

An alternative optimization method would be a maximum-optimization which minimizes the following merit-function:

$$F = \max_{i \in (1,\ldots,N)} (|a_i|)$$

Target aberrations in the optimization procedure may be individual Zernike coefficients, for instance. Alternatively, other parameters indicative of imaging characteristics may be used, such as the wavefront-RMS over all points in an exposure field, which may be derived from a number of individual Zernike coefficients. Use of simulations or models wherein different contributions of individual parameters, such as Zernike coefficients, are weighted differently in a target function, may also be employed, an example of which would be a linear function wherein differently weighted Zernike coefficients are added up. Alternatively, optimization may be carried out with regard to lithographic parameters which are generally dependent on a particular type of application or pattern of the patterning structure used in the lithographic process.

The imaging characteristic (s) may be determined in a number of ways known in the art.

In one exemplary embodiment, the imaging characteristics are determined by imaging a test object having a pattern of critical dimensions in the reticle (patterning structure) plane onto a photo-sensitive substrate, developing the substrate and evaluating the pattern of critical dimensions on the developed substrate, for instance by scanning electron microscopy, in order to determine the imaging characteristics of the projection exposure system. A critical dimension test structure is, for instance, disclosed in U.S. Pat. No. 6,449,031. As another example, U.S. Pat. No. 6,331,368 describes a test object for use in detecting aberrations of optical imaging systems.

In other exemplary embodiments, the imaging characteristics may be determined by simulation of an imaging performance. The simulation may be carried out on the basis of the particular design of the illumination and/or projection optical system and/or characteristics of elements of the afore-mentioned systems, which may have been determined before or after assembly of the projection exposure system.

In exemplary embodiments of the present invention, the method further comprises measuring the respective imaging characteristic(s) and determining the optical parameters in dependence of the measured imaging characteristic(s).

Measuring the imaging characteristic(s) may be performed by a number of methods known in the art. Modern projection exposure systems generally comprise means to measure imaging characteristics such as residual aberrations in-situ.

In one exemplary embodiment, measuring the imaging characteristic(s) in a field comprises generating an aerial image of a wavefront of light having passed the projection optical system, reconstructing the wave-front from the aerial image and determining the imaging characteristic(s) from the reconstructed wave-front. In other exemplary embodiments, imaging characteristics are measured by use of interferometric methods. Interferometric methods comprise such methods as Twyman-Green interferometry, Fizeau interferometry, point diffraction interferometry and shearing interferometry. In other exemplary embodiments of the present invention a Hartmann-type sensor may be used to measure the imaging characteristic(s) in a field.

The Hartmann-technique, for instance, generally involves splitting a wavefront in a pupil plane of the projection optical system into a plurality of portions and measuring a gradient of each split wavefront portion. Thus, an aberration of the split portion and an aberration of the whole wavefront can be determined. An example of a wavefront detecting method using the Hartmann-technique is described in US 2002/0159048 A1, the entire contents of which is incorporated by reference herein.

U.S. Pat. No. 5,828,455, the entire contents of which is incorporated by reference herein, describes a method and apparatus for analyzing a wavefront at a multiplicity of field points over an entire lens train. The method is based on the finding that upon irradiating a reticle, spots are created at an image plane of the projection optical system which are deviated from their diffraction-limited positions, which deviation can be measured. The method includes using an aperture plate consisting of a multiplicity of openings with each opening being centered underneath a neighborhood of points accepted into an entrance pupil of an imaging objective. Points passing through all openings will produce a number of spot arrays in a substrate-plane. The totality of all the arrays of spots whose centroids can be measured and reconstructed yields an aberrated wavefront at a number of discrete field points.

Thus, an in-situ analysis of a wavefront having passed the projection optical system in a projection exposure system is provided.

In US 2002/0001088 A1 a method and apparatus for detecting wavefronts by shearing interferometry are disclosed, the entire contents of which is incorporated by reference herein.

For measuring uniformity of illumination or transmission, i.e. spatial distribution of light intensity, a photoelectric sensor may be also used. A photoelectric transducer element would be an example for such a sensor. The sensor may either be able to spatially resolve a light intensity distribution or may scan various points in the field to determine the light intensity distribution in dependence of the light intensities measured in different scanned points across the field.

When the field dimensions or/and position are changed from first field dimensions or/and position to second field dimensions or/and position, the imaging characteristic (s) may be measured within the second field having second field dimensions or/and position or, in general, within a field having field dimensions larger than the second field dimensions. The same applies for the first exposure field and respective sub-fields. Measuring the imaging characteristics in a field having field dimensions larger than the field dimensions for which the imaging performance is to be optimized has an advantage in that it often allows for an increased accuracy of the measured imaging characteristic(s). This can be attributed to the finding that measuring an image characteristic in a larger field allows to obtain more data points and thus a better fit of measured data points to a distribution of data points.

In exemplary embodiments, the method of optimizing an imaging performance according to the first aspect further comprises determining optical parameters for a plurality of second settings for a plurality of second field dimensions or/and positions and storing the optical parameters of the plurality of second settings associated with the second field dimensions or/and positions. Thus, look-up tables may be generated which comprise the settings of optical parameters for associated field dimensions or/and positions. Likewise, exemplary embodiments of the method according to the second aspect of the present invention further comprise determining optical parameters for a plurality of settings for a plurality of sub-field dimensions or/and positions and storing the optical parameters of the plurality of settings associated with the sub-field dimensions or/and positions.

In exemplary embodiments of the present invention according to the first aspect, the method further comprises determining the optical parameters of the second setting in dependence of a plurality of stored optical parameters in dependence of the second field dimensions or/and position. Likewise, the method according to the second aspect may further comprise determining the optical parameters of the setting in dependence of a plurality of stored optical parameters in dependence of the sub-field dimensions or/and positions or/and the type of feature.

The stored optical parameters are most preferably the stored optical parameters determined in dependence of measured imaging characteristic(s). Alternatively, the stored optical parameters may be based on optical parameters determined by simulation, interpolation or other kind of calculation. Optical parameters determined in dependence of measured imaging characteristics may form the basis for the simulation, interpolation or other kind of calculation. Alternatively, optical parameters based purely on optical parameters simulated from data of the optical design of the projection exposure system may be the stored optical parameters.

An embodiment where the stored optical parameters are the stored parameters determined in dependence of the imaging characteristics (preferably measured imaging characteristics) is preferred when a plurality of second settings has been determined in dependence of imaging characteristics (preferably measured imaging characteristics) and a second field size is chosen for which there is no second setting based on measured imaging characteristics. In that case, a second setting or optical parameters, respectively, may be determined based on the existing settings which saves the time for measuring imaging characteristics in the second field. Also, this embodiment is advantageous if a projection exposure system does not comprise means for measuring imaging characteristics and imaging characteristics were measured in a plurality of second field sizes in succession on just one occasion, for instance prior to taking the projection exposure system into operation for exposures. Analogous considerations apply when optimization is carried out for one or more sub-fields, in accordance with the second aspect of the present invention.

When field dimensions or/and position is/are changed to a field dimensions or/and position that was/were used previously or for which stored optical parameters exist, the setting associated with those/that field dimensions or/and position may be retrieved from the stored settings of optical parameters and thus render the need for an additional measurement of imaging characteristics and determination of optical parameters therefrom unnecessary, thus saving time and cost.

As described above, measurements of imaging characteristics and determination of optical parameters may be carried out in succession for a plurality of field dimensions or/and positions/sub-fields and the settings associated with the fields dimensions or/and positions/sub-fields stored. It is generally preferred, however, to measure imaging characteristics after a change of field dimensions or/and position or for each sub-field since this may yield more accurate results for the imaging characteristic, in particular in view of the fact that imaging characteristics may vary in time and that prolonged exposure to illumination light may alter the properties of at least some of the optical elements.

In exemplary embodiments, changing or setting the optical parameters includes at least one of: changing/setting a position of the patterning structure, changing/setting a position of the substrate, changing/setting a gas pressure in a volume between adjacent optical elements of the projection exposure system, changing/setting a refractive index in a volume between adjacent optical elements of the projection exposure system, changing/setting a wavelength of light illuminating the patterning structure, displacing an optical element of the projection exposure system with respect to other optical elements thereof, deforming an optical element of the projection exposure system, changing/setting a transmission characteristic of an optical element of the projection exposure system, replacing an optical element of the projection exposure system with another optical element, changing/setting an aperture of a diaphragm provided in the projection exposure system.

In the method according to the second aspect of the present invention, setting the optical parameters may include at least one of: setting a position of the patterning structure, setting a position of the substrate, changing a gas pressure in a volume between adjacent optical elements of the projection optical system, setting a refractive index in a volume between adjacent optical elements of the projection optical system, setting a wavelength of light illuminating the patterning structure, displacing an optical element of the projection optical system with respect to other optical elements thereof, deforming an optical element of the projection optical system, setting a transmission characteristic of an optical element of the projection optical system, replacing an optical element of the projection optical system with another optical element, setting an aperture of a diaphragm provided in the projection optical system.

Changing a position of the patterning structure may involve a tilt of the patterning structure in an arbitrary direction relative to an optical axis of the projection exposure system, a displacement parallel to the optical axis or a displacement in a plane perpendicular to the optical axis.

Likewise, changing a position of the substrate may involve a tilt of the substrate in an arbitrary direction relative to the optical axis of the projection exposure system or a displacement parallel to the optical axis or a displacement in a plane perpendicular to the optical axis. A displacement in the direction of the optical axis may be used to respond to changed focus conditions, for instance.

The reticle is generally held on a reticle stage comprising a drive mechanism and motor which allow for a fine movement in the above-referred directions, likewise the substrate is held on a substrate stage. Preferably, when changing a position of the substrate and/or the reticle, the positions of both the substrate and the reticle are determined by respective position detection systems. Patterning structures other than reticles may be held and moved by similar means.

A gas pressure or temperature in a volume (sealed space) between adjacent optical elements of the projection exposure system and/or a refractive index of a gas in a volume between adjacent optical elements of the projection exposure system may be changed so as to manipulate an imaging performance, in particular with respect to projection magnification and/or focal position and/or field curvature of a projection optical system which are dependent on factors such as atmospheric temperature, atmospheric pressure as well as temperature of optical elements. Gases suitable for this purpose will strongly depend on the wavelength of the illumination light as well as the dependency of the refractive index on the pressure change which is characteristic of the nature and/or chemical composition of the gas. At wavelengths below 200 nm, for instance, oxygen exhibits substantial absorption bands which necessitates operation of the projection exposure system under an atmosphere of inert gas. Examples of projection exposure apparatus comprising means for changing a gas pressure may be found in U.S. Pat. Nos. 4,690,528 and 4,871,237, the entire contents of which are incorporated by reference herein.

Changing an optical parameter may also comprise changing a wavelength of light illuminating the patterning structure in order to adjust imaging characteristics, such as coma.

An example of a change of wavelength in combination with a change of at least one of a position of the reticle, a position of the object or wafer, respectively, and a position of one or more lenses in order to compensate for a change of the imaging performance of the projection exposure system induced by a variation in atmospheric conditions of the environment the projection exposure system is exposed to is disclosed, for instance, in U.S. Pat. No. 4,961,001, the entire contents of which is incorporated by reference herein.

In other exemplary embodiments, changing an optical parameter may involve displacing an optical element of the projection exposure system with respect to other optical elements thereof. Depending on the type of aberration, the optical element is displaced along or perpendicular to the optical axis of the projection exposure system. In other exemplary embodiments, the optical element may be rotated to some degree around the optical axis. Thus,—for a non-rotationally symmetric element—imaging characteristics such as aberrations, in particular a distortion aberration, spherical aberration, coma and astigmatism may be adjusted. Displacement of optical elements along the optical axis may be performed by actuators or other optical element drive means and a drive control element. For instance, a guided barrel which is movable by air pressure may be used for this purpose, as described in U.S. Pat. No. 6,256,086, for example, the entire contents of which is incorporated by reference herein. One or more optical elements may be independently driven. Which optical element or combination of optical elements would be suitable for adjustment of a certain type of imaging characteristics generally depends on the particular design of the projection optical system and the position of the respective optical element in the projection optical system. Some optical elements may have an influence on curvature of field and astigmatism, for instance, which can be more easily controlled as compared to other optical elements. Other optical elements, on the other hand, may be better suited to adjust a spherical aberration, as described, for instance, in U.S. Pat. No. 6,078,380 the entire contents of which is incorporated by reference herein. Methods for adjusting imaging characteristics such as aberrations by displacing one or more optical elements and/or one or more groups of optical elements are well known in the art. An additional example of displacement of optical elements may be found in U.S. Pat. No. 5,973,863, the entire contents of which is incorporated by reference herein. A further example can be found in US Patent Application No. 2003/063268 A1, the entire contents of which is incorporated by reference herein.

A method and system for controlling telecentricity is described in U.S. Pat. No. 5,739,899, for instance, the entire contents of which is incorporated herein by reference. The projection exposure system disclosed therein comprises an adjusting member disposed in the illumination optical system to change telecentricity on the substrate. The system further comprises a second adjusting member for adjusting at least one of the position of the substrate in the direction of the optical axis of the projection optical system and the tilt of the substrate.

In other exemplary embodiments, an optical element of the projection exposure system may be deformed to adjust its optical characteristics and thus imaging characteristics. The deformation of the optical element may be through use of an actuator applying pressure to one or more predetermined points of the optical element. The optical element may be, for instance, a reflective element such as a mirror which may be locally deformed to correct for certain kinds of aberrations. An example of a deformable optical element can be found in U.S. Pat. No. 6,307,688 as well as U.S. Pat. No. 6,388,823, the entire contents of which are incorporated by reference herein. Further examples of deformable optical elements may be found in US Patent Application No. 2003/002023, US Patent Application No. 2002/048096 and laid-open PCT Application WO 2003/036359 A2, the entire contents of which are incorporated by reference herein.

Changing an optical parameter may also comprise changing a transmission characteristic of an optical element of the projection exposure system. The optical element may be, for instance, an adjustable filter such as an adjustable grey filter positioned in the illumination optical system. The grey filter may be adjusted specifically to control illumination uniformity and compensate for variations in light intensity in a dipole illumination mode, for instance.

In other exemplary embodiments of the present invention, an optical parameter might be changed by replacing an optical element of the projection exposure system with another optical element.

In preferred embodiments of the present invention, an optical integrator system is exchanged when the field size is changed in order to improve illumination efficiency. Generally, the illumination optical system or beam delivery system suitable for use with the present invention may be any beam delivery system known in the art. For instance, the beam delivery system may be one as described in U.S. Pat. No. 6,285,443, the entire contents of which is incorporated herein by reference. Said beam delivery system comprises a light source, a beam expander to expand a beam of light generated by the light source, a diffractive optical element adapted to set an illumination mode, i.e. a particular pupil fill, an objective and a second diffractive optical element for introducing a divergence of light in a rectangular shape having an aspect ratio which corresponds to an aspect ratio of a glass rod further on in the beam delivery system. Light exiting from the second diffractive optical element passes an in-coupling optic which guides the light beam onto an entry surface of the glass rod which homogenizes and mixes the light so as to increase homogeneity of a light distribution across a pupil plane. A reticle masking system defining an adjustable field diaphragm is provided in an intermediate field plane disposed directly at an exit face of the glass rod. Generally, the field diaphragm is adjusted so as to define a size of an illuminated region on the reticle. By decreasing a size of an aperture defined by the field diaphragm, generally, a portion of the light exiting from the exit face of the glass rod is blocked out, thus decreasing an illumination efficiency.

In contrast, in the present invention, optimizing an imaging performance may also comprise increasing an illumination efficiency by replacing an optical integrator system, i.e. an optical integrator and optical elements associated therewith, with another optical integrator system. The optical elements associated with the optical integrator, which is preferably a glass rod, are those which serve to bring the light beam into a shape which corresponds to the shape of the entry face of the optical integrator. In the beam delivery system described above, the glass rod and the second diffractive optical element would be exchanged. If entry and exit faces of the glass rod have a smaller surface, the second diffractive optical element will also have to be adapted to provide a form and size of illumination which corresponds precisely to the form and size of the entry face of the optical integrator. Thus, rather than blocking out a portion of the light, the light beam is concentrated on a smaller area resulting in increased illumination efficiency. The light intensity per unit area is thus increased, which may permit a higher throughput of exposures in the projection exposure system. The aspect ratio, i.e. ratio of width to height, for instance, of the glass rod, is adapted to the aspect ratio of the region to be illuminated on the patterning structure. It is a feature of this embodiment, that, whilst the size of the illuminated region on the patterning structure is changed, the shape of illumination in the pupil plane of the illumination optical system and the size of the pupil which is illuminated remains substantially unchanged. Refractive lens rasters made of heat or/and radiation resistant material may be used in place of the diffractive optical elements in the embodiment described above.

In accordance with this embodiment of the present invention, the illumination optical system comprises means for exchanging an optical integrator and optical elements associated with the optical integrator. The diffractive optical element (DOE) and the glass rod could be, for instance, mounted on a turret plate which can be turned so as to bring a desired glass rod and the corresponding DOE into the light path.

In a third aspect, a projection exposure system is provided which is adapted to carry out the method of optimizing an imaging performance in accordance with a first and second aspect of the present invention.

A projection exposure system comprising an illumination optical system with an exchangeable optical integrator system as described above is also provided in a fourth aspect of the present invention. In particular, the projection exposure system comprises an illumination optical system having a pupil plane and including a light source for illuminating a patterning structure and a projection optical system for imaging a region of the illuminated patterning structure into a corresponding field in a substrate-plane for exposing substrates with images of the patterning structure in a manufacturing process of miniaturized articles formed from the exposed substrates, wherein the illumination optical system comprises a first optical integrator system for illuminating a first region of a first size of a patterning structure, and at least a second optical integrator system for illuminating a second region of a patterning structure which (second region) has a second size which is different from the first size, wherein the first and at least second optical integrator are arranged such that the first optical integrator can be exchanged for the at least second optical integrator system and wherein a distribution of illumination intensity in a pupil plane of the illumination optical system in terms of shape and size is substantially the same for the first and at least second optical integrator system.

In illumination optical systems which do not have glass rods or the like as optical integrators, the second diffractive optical element or refractive raster element, respectively, would have to be exchanged to achieve a similar effect. Thus, preferably, the first and at least second optical integrator system comprise a diffractive or refractive optical element. In other exemplary embodiments, the first and at least second optical integrator system further comprise a glass rod.

In other exemplary embodiments, the first and at least second optical integrator system comprise a fly's eye condenser.

Changing an optical parameter may comprise changing an aperture of a diaphragm provided in the projection exposure system. The diaphragm may be positioned in the illumination optical system or in the projection exposure system. Changing an aperture of a diaphragm may be, in dependence of the position of the diaphragm, associated with a change in numerical aperture, such as in the case of a diaphragm in the pupil plane of the projection optical system. A diaphragm in the illumination system may also be used to change a distribution of illumination across the pupil plane of the illumination optical system.

The imaging performance of the projection exposure system, according to the first aspect of the present invention, may be optimized for given field dimensions or/and a given field position in combination with a given illumination mode or in combination with a given patterning structure pattern. Whilst the imaging performance is optimized primarily with respect to given field dimensions or/and a given field position, the imaging performance may be further adapted to a certain kind of illumination mode or a given patterning structure pattern.

In preferred embodiments of the present invention, the first and second exposure fields are used for exposing substrates with images of a patterning structure in a manufacturing process of miniaturized articles formed from the exposed substrates. The first and second exposure fields may be exposed with images of different patterning structures or different regions of the same patterning structure, for instance. Likewise, the exposure field in the method according to the second aspect of the present invention would be used for exposing substrates with images of the patterning structure in a manufacturing process of miniaturized articles from the exposed substrates.

The projection exposure system used in the method of the present invention may be any suitable known projection exposure system. The projection optical system comprised in the projection exposure may be dioptric, catoptric or catadioptric.

As used herein, the term "light source" is meant to encompass also those embodiments, where more than one light source make up the light source of the illumination optical system, such as when two lasers are used as a light source.

In exemplary embodiments, the projection exposure system is a step-and-repeat projection exposure system. Preferably, the projection exposure system is a scanning type exposure system. In a scanning-type exposure system, the reticle and the substrate are simultaneously scanned relative to the projection optical system thus allowing an increase in throughput as compared to step-and-repeat type projection exposure systems.

In another aspect a method of optimizing an imaging performance of a projection exposure system is described. The projection exposure system comprises an illumination optical system including a light source for illuminating a patterning structure and a projection optical system for imaging a region of the illuminated patterning structure onto a corresponding field in a substrate-plane. The method comprises setting the field to a first exposure field, the first exposure field having first field dimensions and a first position within a maximum field exposable by the projection exposure system, and setting optical parameters of the projection exposure system, for instance in particular the projection optical system, to a first setting such that an imaging performance quantity within the first exposure field at the first setting satisfies a first performance condition. The method also comprises changing the field to a second exposure field, the second exposure field having at least one of second field dimensions different from the first field dimensions and a second position within the maximum field exposable by the projection exposure system, which second position is different from the first position, and changing the optical parameters of the projection exposure system, for instance in particular the projection optical system, to a second setting such that an imaging performance quantity within the second exposure field at the second setting satisfies a second performance condition. The imaging performance quantity associated with the second exposure field at the second setting is better than an imaging performance quantity associated with the second exposure field at the first setting.

In a further aspect, a method of optimizing an imaging performance of a projection exposure system is provided. The projection exposure system comprises an illumination optical system including a light source for illuminating a patterning structure, and a projection optical system for imaging a region of the illuminated patterning structure onto a corresponding field in a substrate-plane, which region comprises a first sub-region, wherein the first sub-region of the patterning structure is imaged onto a corresponding first sub-field within the corresponding field in the substrate-plane. The method comprises setting the field to an exposure field, the exposure field having field dimensions and the first sub-field having first sub-field dimensions and a first sub-field position within the exposure field, wherein the first sub-field dimensions are different from the field dimensions. The method also comprises setting optical parameters of the projection exposure system, for instance in particular the projection optical system, to a setting such that an imaging performance quantity within the first sub-field satisfies a first performance condition with regard to a first imaging characteristic, and such that the imaging performance quantity with regard to the first imaging characteristic is better within the first sub-field than an imaging performance quantity within an area within the exposure field which is situated outside the first sub-field.

In addition, the first sub-region of the patterning structure may comprise features of a first type, wherein satisfying the first performance condition with regard to the first imaging characteristic within the first sub-field permits imaging the features of the first type at a predetermined quality level for a subsequent production process. Specifying a predetermined quality level for imaging features may include, for example, specifying, a requirement on feature resolution (e.g., minimum feature size requirement), specifying a maximum allowable registration error between superimposed patterns, or any other suitable quality measure or combination of quality measures.

The first and second performance conditions relating to imaging performance may be any suitable conditions, such as minimizing an RMS value of an aberration (or other characteristic) over a respective exposure field or sub-field, minimizing a value of another merit function such as described herein, or specifying particular values of such quantities. Also for example, the first and second performance conditions may be any condition imposed on any imaging characteristic or any suitable combination of imaging characteristics (e.g., aberration, illumination, resolution, registration of superimposed patterns, etc.) and others such as those disclosed herein. It will be recognized that determining such performance conditions may depend on the requirements of a given imaging process associated with a desired application and is within the purview of one of ordinary skill in the art depending upon the requirements at hand. An imaging performance quantity, likewise, may be a value of any such imaging characteristic or a combination of values of any suitable combination of such imaging characteristics.

Considerations and exemplary embodiments as set out above are equally applicable to the two latter aspects, as will be apparent to the person skilled in the art.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Optimization of an imaging performance is described hereinbelow with reference to various embodiments. In the first to fifth embodiments, various aberrations are chosen as indicators of an imaging performance and examples for various sizes and positions of exposure fields and sub-fields are given.

In the first embodiment of the present invention, optimization of a projection exposure system with regard to astigmatism as a typical type of aberration is carried out.

First, astigmatism values are optimized for a first field size, which is the maximum exposable field size, then the exposure field is changed to an exposure field of a second field size, which is smaller than the first field size and astigmatism is optimized for the second field size.

A distribution of astigmatism values across an exposure field (a slit in case of a scanning projection exposure system, for instance) can be mathematically expressed as a function of the field size or height (slit-height in case of a scanning projection exposure system), respectively, which function comprises a constant term, a linear term and a quadratic term.

After assembly of the projection optical system, an imaging performance is optimized for a maximum exposable field size.

Astigmatism can be adjusted by various means: The constant term of the astigmatism can be adjusted by rotation or deformation of at least one optical element in the projection optical system. The linear term of the astigmatism may be adjusted by displacement of one or several optical elements perpendicular to the optical axis or tilt of an optical element or a group of elements. The quadratic term of the astigmatism may be controlled by displacement of optical elements parallel to the optical axis, by changing a gas pressure in at least one volume between adjacent optical elements or by changing a refractive index in a volume or a group of volumes between adjacent optical elements.

Figure 1:
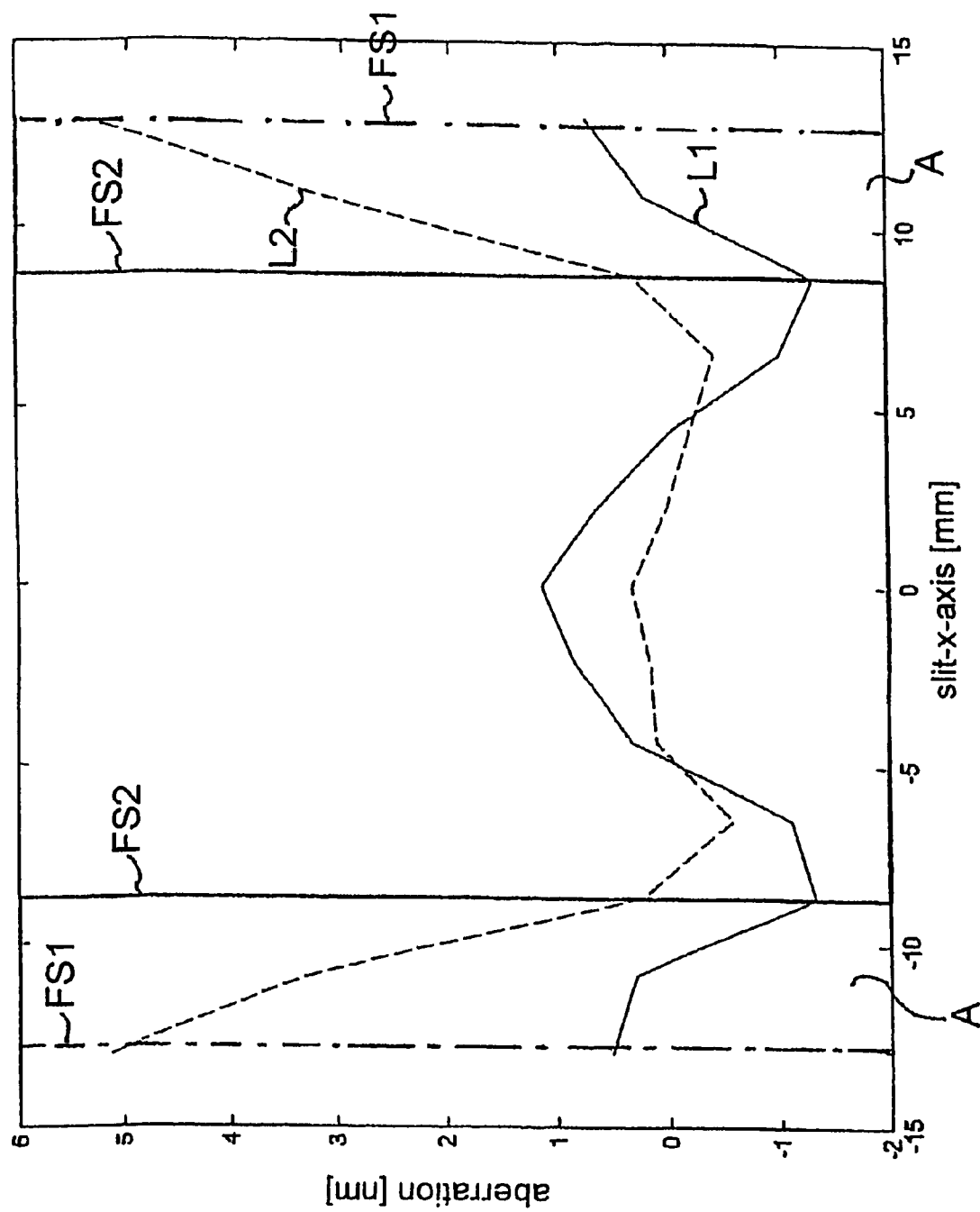
FIG. 1 shows an optimized distribution of astigmatism values in a first and in a second field according to a first embodiment of the present invention.

The black line L1 in FIG. 1 shows an optimized distribution of values for the astigmatism in units of nanometers across the first exposure field of the maximum exposable field size. The slit height associated with the maximum exposable field size was about 26 mm, i.e. ±13 mm on the slit-x-axis, as indicated by lines denoted "FS1". The slit height refers to the dimension of the exposure field, in the direction perpendicular to the scanning direction. As can be seen from FIG. 1, a maximum difference between minimum and maximum values of astigmatism is less than 3 nm.

The field size is subsequently changed to the second field size which is smaller than the first field size. In this embodiment, the second field size was chosen to have a slit height of about 15 mm, i.e. ±7.5 mm on the slit-x-axis. The astigmatism was adjusted by one or more of the above-mentioned adjustment means to result in the distribution depicted in FIG. 1 as the broken line L2. As can be seen, optimizing the astigmatism for the smaller second field size (edges of which are indicated by black lines denoted "FS2") allows smaller values of astigmatism within the second exposure field resulting in better imaging performance than could be achieved with the setting optimized for the maximum exposable field size. The distribution of the astigmatism values in the setting for the second field size also shows that using this second setting would not yield acceptable imaging performance for the first exposure field since the astigmatism values are small within the second exposure field but have values as high as 5 nm in the area of the first exposure field which extends beyond the edges of the second exposure field, which area is indicated as "A" in FIG. 1. Thus, optimizing imaging performance with respect to the field size used in a given application yields improved performance.

In the second embodiment of the present invention, coma is used as another example of an aberration to illustrate optimization of the projection exposure system with respect to a specific field size.

The coma-distribution across the slit may be expressed mathematically as a function of slit-height comprising a constant term and a linear term. The constant term of the coma may be controlled by displacement of an optical element or a group of elements in a direction perpendicular to the optical axis in the projection optical system or by a tilt of elements or groups of elements. The linear term of the coma may be adjusted, for instance, by displacement of one or more optical elements parallel to the optical axis in the projection optical system or by a change of pressure in between optical elements or a change of wavelength of the illumination light.

The dimensions of the first and second field size or their slit heights, respectively, were the same as in the first embodiment, and indicated by the same reference signs as in FIG. 1.

Figure 2:
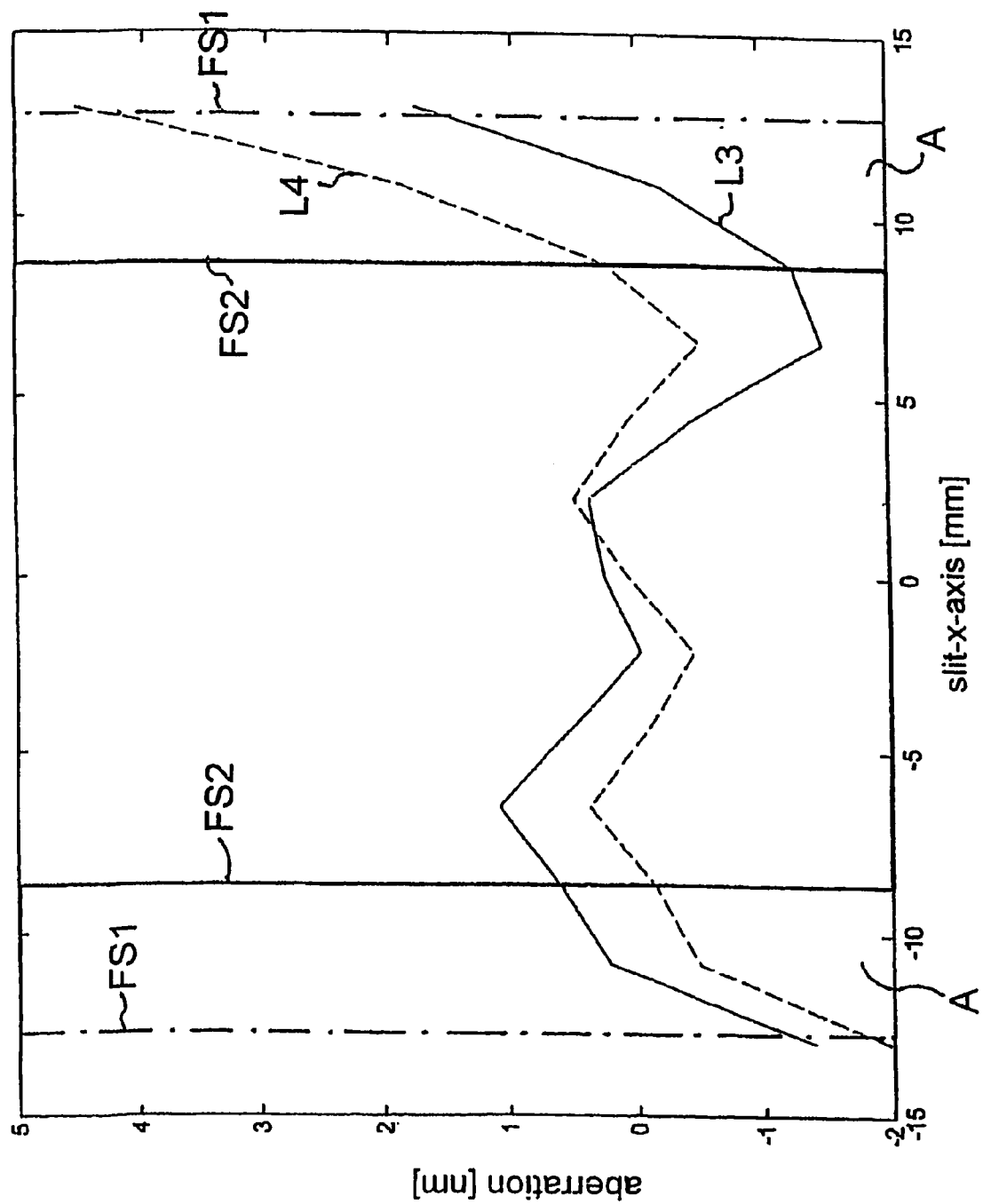
FIG. 2 shows an optimized distribution of coma values in a first and in a second field according to a second embodiment of the present invention.

Coma was optimized for the first field size by use of one of the adjustment means referred to above. The black line L3 in FIG. 2 depicts a distribution of coma values in the optimized setting for the first field size (between dashed lines denoted "FS1"). The broken line L4, on the other hand, depicts a distribution of coma values in a setting which has been optimized for the second field size (i.e. between the black lines denoted "FS2"). As in the first embodiment, a field size has an optimized setting associated therewith which yields better results than the setting for another field size. In this embodiment, a distribution of coma values with a smaller deviation from an average coma value can be chosen for the second field size only because the coma values in the area A of the field in between the edge of the second field and the edge of the first field do not exert an influence on the imaging performance in the smaller second field size. Thus, this setting is optimized for the second field size whilst the setting which was optimized for the first field size would not yield optimum imaging performance in the exposure field having the second field size.

In the first and second embodiments of the present invention, different types of aberrations have been treated independently from one another. However, it is possible for a person skilled in the art to combine these solutions and carry out an optimization procedure of the different types of aberrations in parallel. Furthermore, the mentioned types of aberrations are only examples. By calculation of optical properties of the projection optical system, many other types and field-distributions of aberrations can be found and corrected individually.

Figure 3:
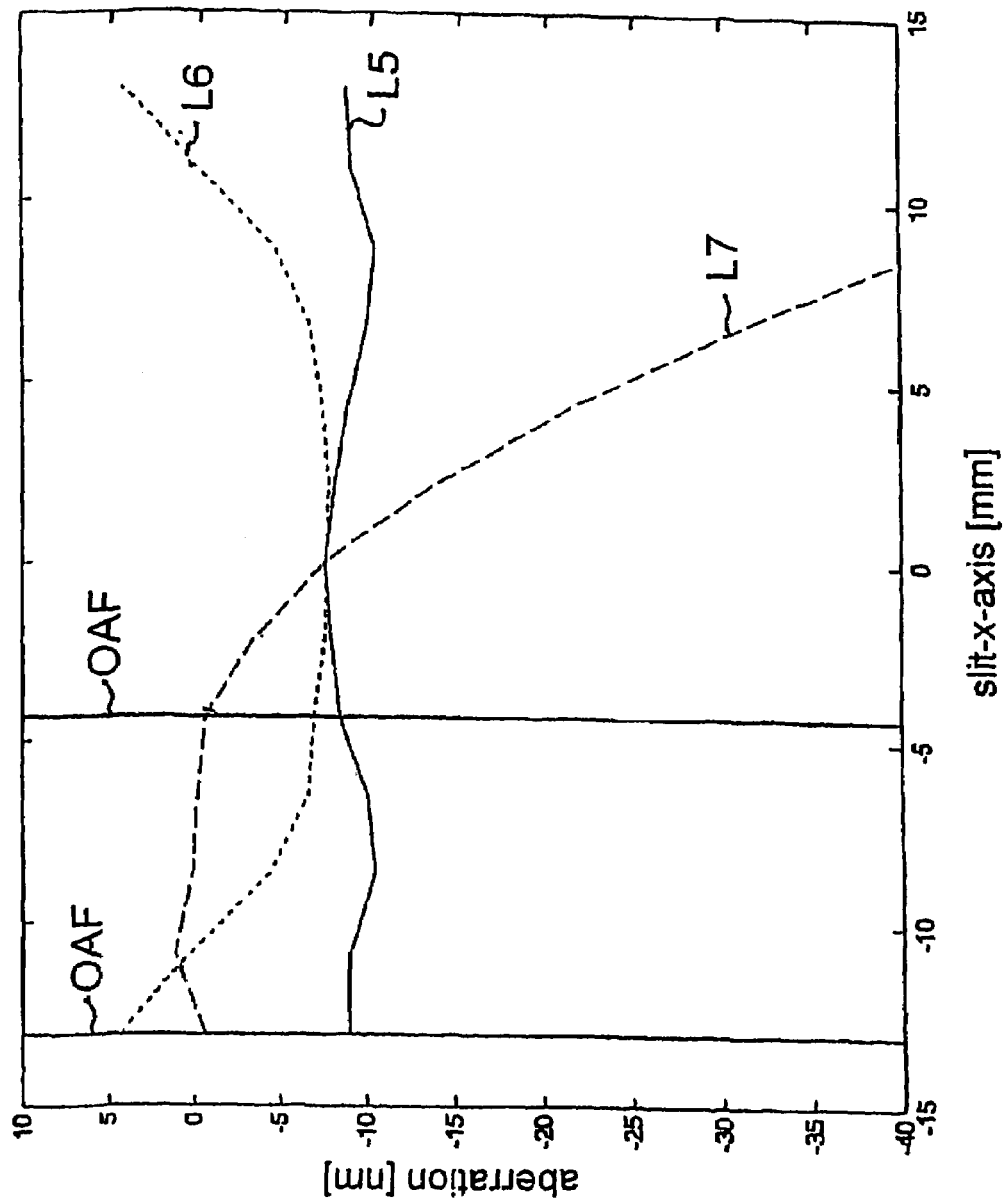
FIG. 3 shows a distribution of astigmatism values prior to optimization as well as a distribution of astigmatism values after optimization to the entire maximum exposable field as well as an off-axis exposure field, according to a third embodiment of the present invention.

In the third embodiment according to the present invention, an example of a projection exposure system with regard to astigmatism in an off-axis exposure field, i.e. an exposure field situated off-centre within the maximum exposable field is given. In the projection exposure system according to the third embodiment, no deformable lens is provided. The linear and quadratic term of the astigmatism may be adjusted as described in connection with the first embodiment. The constant term of the astigmatism may be adjusted by displacement of one or more optical elements due to the off-axis nature of the exposure field. In FIG. 3, a solid line L5 depicts astigmatism values before an optimization procedure is carried out. The high values of the astigmatism may be due to a fault in the production or assembly of the projection exposure system or due to material degradation or lens heating. In an optimum case, the value of the aberration would be zero. The dotted line L6 in FIG. 3 shows a distribution of values for the astigmatism in units of nanometers after an imaging performance has been optimized for a maximum exposable field size (extending from about −13 mm to about +13 mm on the x-axis). The slit height associated with the maximum exposable field size, again, was about 26 mm. Optimization involved displacement of optical elements. The optimization was carried out on the basis of the least-square method. The broken line L7 in FIG. 3 depicts a distribution of values of astigmatism after the projection exposure system has been optimized for an off-axis exposure field the left and right border of which are indicated by black lines denoted "OAF" parallel to the y-axis. As can be clearly seen from the depicted distribution in the off-axis field, values for the astigmatism are significantly smaller and imaging performance thus significantly better as compared to the distribution in the maximum exposable field.

Figure 4:
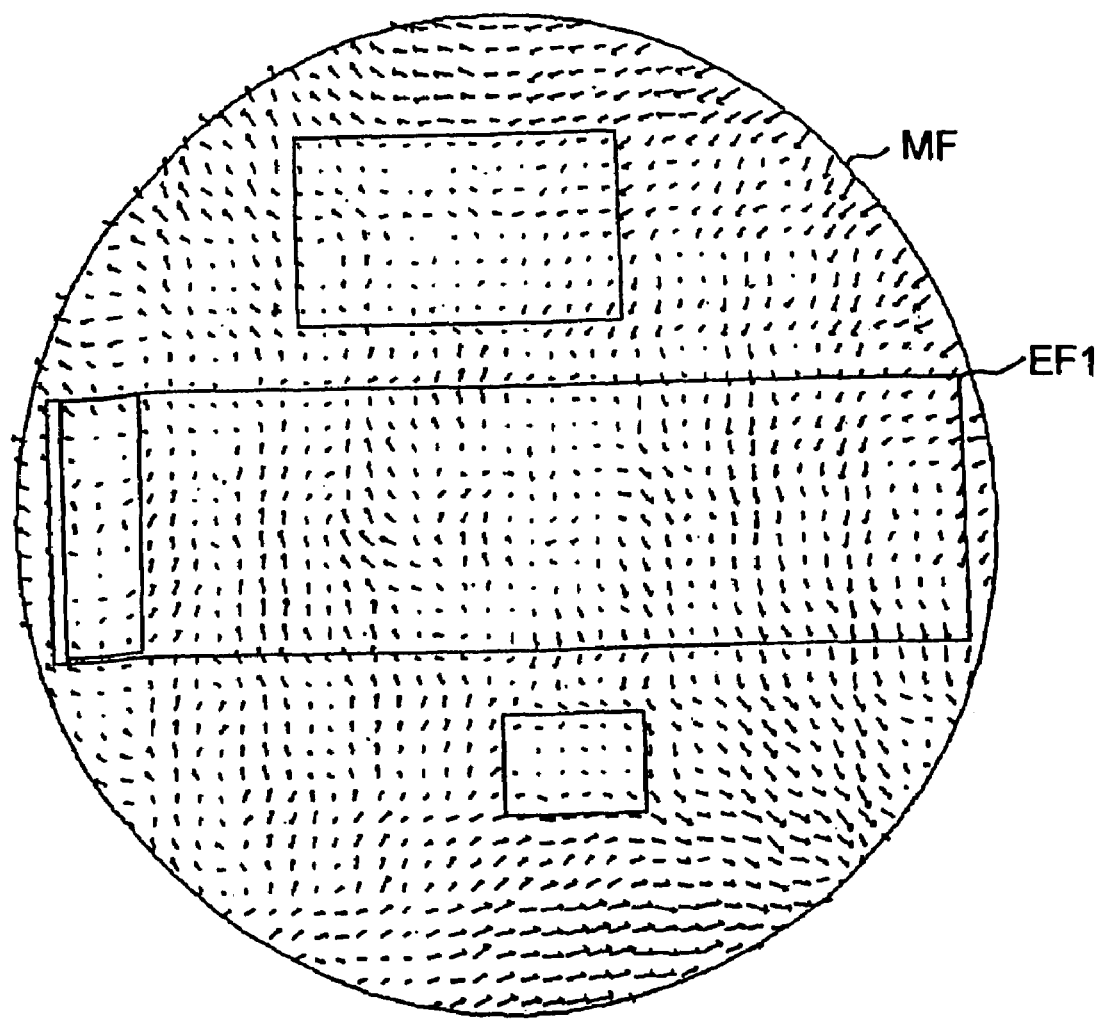
FIG. 4 shows a distribution of distortion values across a maximum exposable field.

FIG. 4 shows an example of a distribution of distortion values across a maximum field exposable by the projection exposure system. The value of the distortion varies across the circular maximum field MF exposable by the projection exposure system. A vector arrow indicates the displacement between a correct position of an imaged point and the actually measured position of the respective imaged point. Those distortions would be typically in the range of 10 nm or smaller. FIG. 4 thus demonstrates that an imaging performance of a projection exposure system may be optimized by choosing a particular position of the exposure field within a maximum field MF exposable by the projection exposure system where values of aberration are particularly suitable and, in this case, low. The rectangles depicted in the maximum field exposable by the projection exposure system in FIG. 4 indicate possible, advantageous positions for exposure fields that my be chosen in accordance with the present invention. The largest rectangle EF1 indicates a standard position of an exposure field having the largest possible slit width, as used in a scanning exposure system. Depending on which kind of aberration is considered particularly critical or important in a given exposure process, distributions of that particular kind of aberration across the maximum field exposable by the projection exposure system may be considered likewise, and in dependence of the respective distribution of that particular kind of aberration a suitable position chosen, thus optimizing an imaging performance of the projection exposure system. In addition to an optimization with regard to aberrations, the same or similar considerations apply for other imaging characteristics, such as uniformity, telecentricity, transmission, illumination efficiency and polarization.

Figure 5:
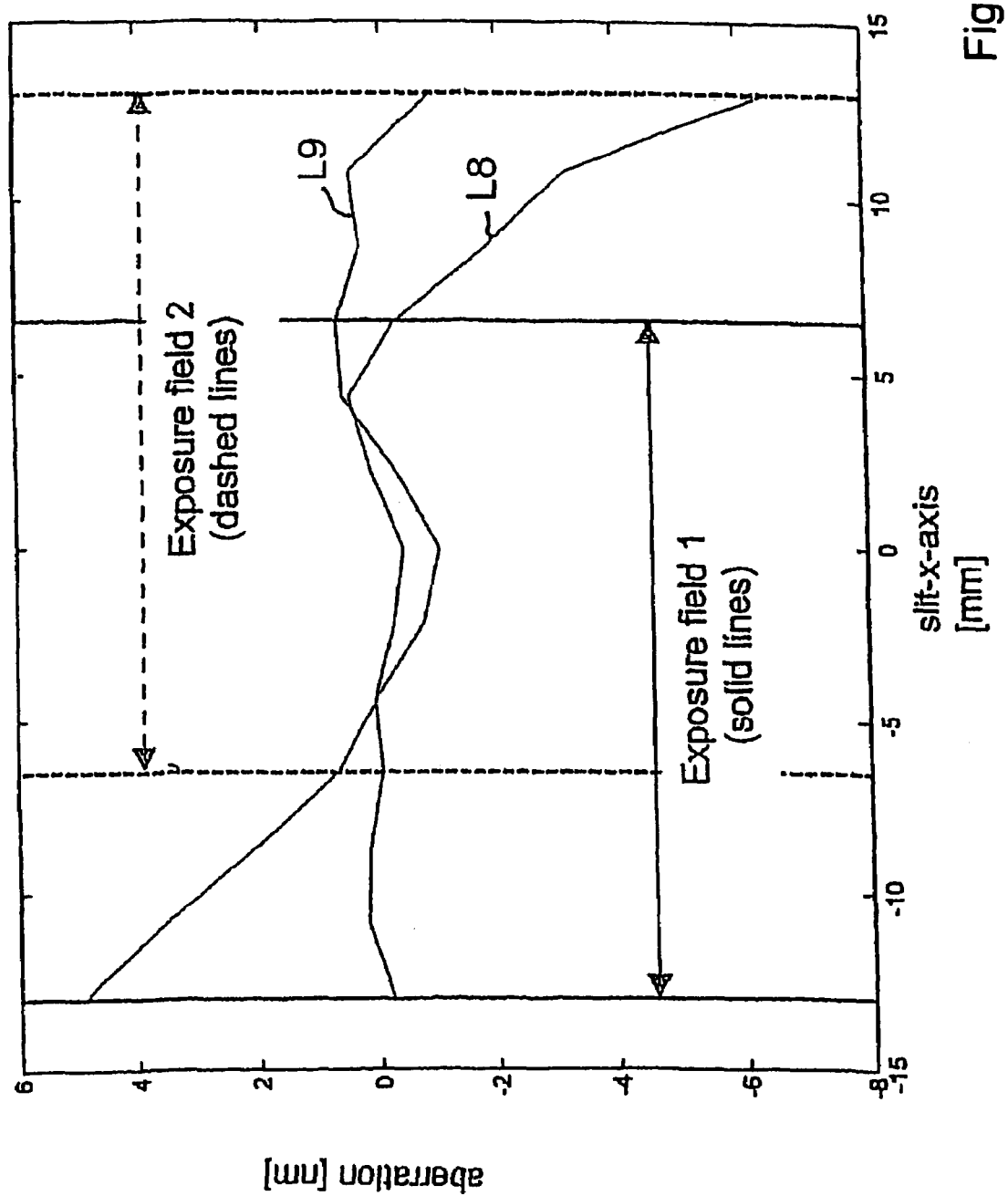
FIG. 5 shows distributions of astigmatism values which have been optimized for two exposure fields, respectively, which have different positions, according to a fourth embodiment of the present invention.

In the fourth embodiment according to the present invention, optimization of astigmatism across two exposure fields of the same dimensions but having different positions within the maximum illumination area is explained with reference to FIG. 5. Adjustment of astigmatism in a projection exposure system is carried out in accordance to what has been described in connection with the previous embodiments. Exposure field 1 is marked by solid black lines in the diagram and extends from about −13 mm on the slit-x-axis to about +7 on the on the slit-x-axis whereas exposure field 2 is marked by a dashed line and extends from about −7 mm on the slit-x-axis to about +13 on the on the slit-x-axis. Both exposure fields have the same size and dimensions, but have a different position within the maximum exposable field, whilst their areas overlap. As can be clearly seen from FIG. 5, a distribution of astigmatism values optimized for exposure field 1, as indicated by line L8, differs from that optimized for exposure field 2, as indicated by line L9. Therefore, optimization will depend on the absolute position of the respective exposure field within the maximum exposable field. On the other hand, optimization can take advantage of different properties of different positions within the maximum exposable field by choosing a particularly advantageous position and optimizing imaging characteristics of the exposure field in that position.

In the fifth embodiment according to the present invention, optimization is carried out for two different sub-fields within the exposure field. The sub-fields correspond to different sub-regions of a patterning structure wherein one sub-region comprises features that are particularly sensitive to a particular kind of aberration, that is that particular kind of aberration would be particularly detrimental to an imaging performance with regard to those particular features, and the other sub-region comprises features particularly sensitive to a different kind of aberration. In this embodiment, the patterning structure comprises two sub-regions wherein the features in one sub-region is particularly sensitive to astigmatism and the features in the other sub-region particularly sensitive to coma. Therefore, the left sub-field is optimized with regard to astigmatism and the right sub-field is optimized with regard to coma. Methods of adjusting these types of aberrations have been described above.

Figure 6:
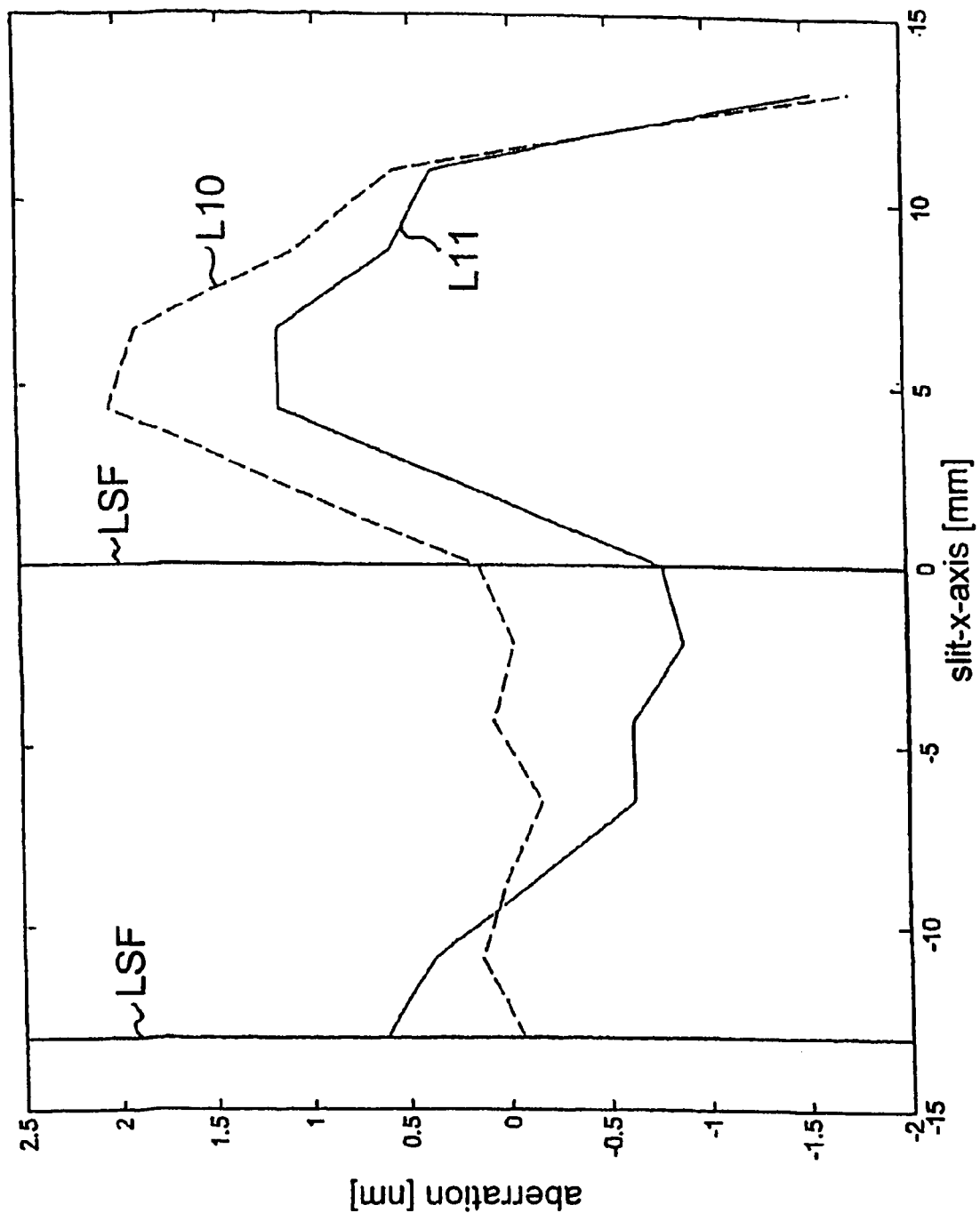
FIG. 6 shows a distribution of astigmatism values optimized for a left sub-field, according to a fifth embodiment of the present invention.
Figure 7:
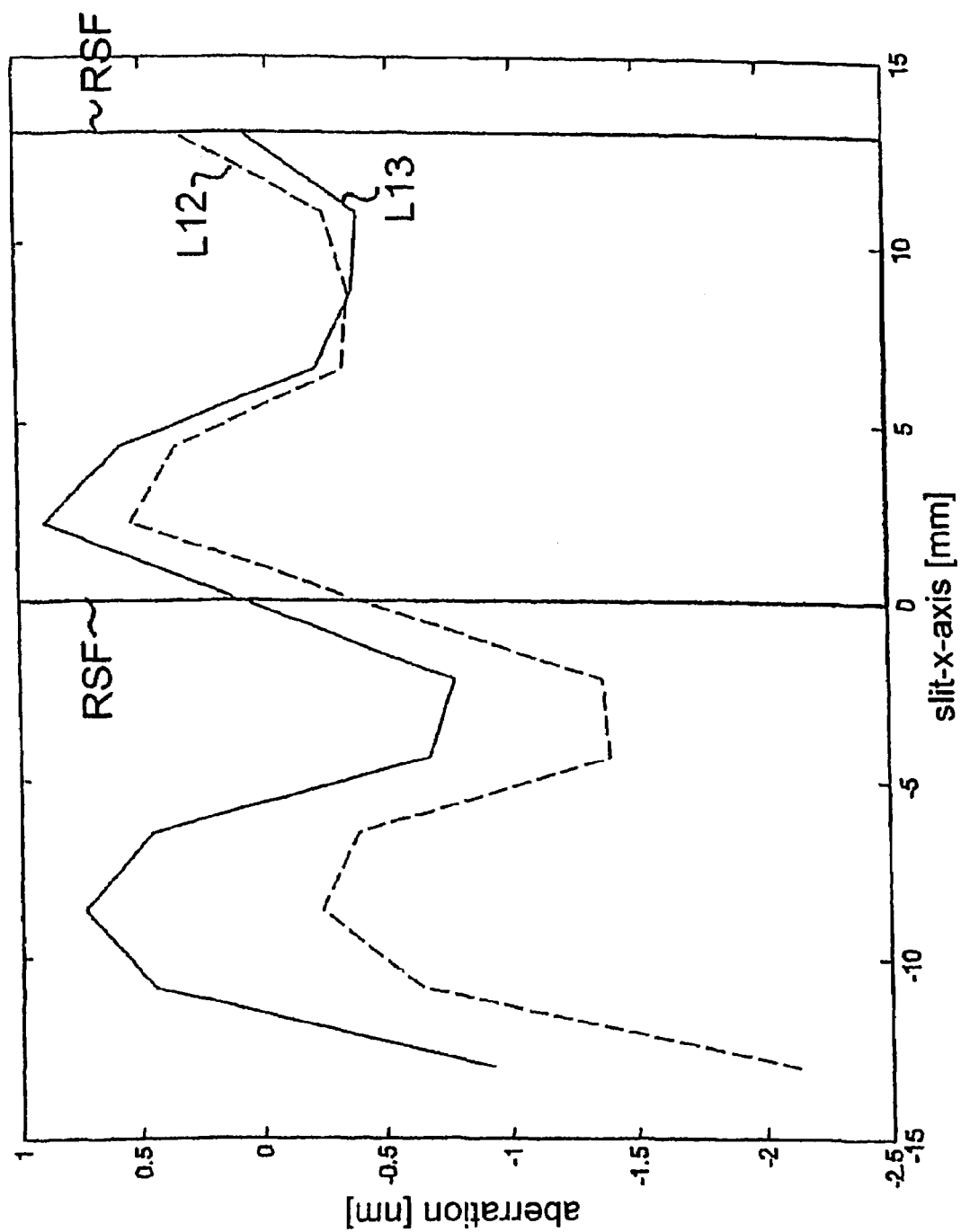
FIG. 7 shows a distribution of coma values optimized for a right sub-field, according to the fifth embodiment of the present invention.

The results of an optimization procedure in terms of distribution of the respective aberration values is depicted in FIGS. 6 and 7. FIG. 6 shows a distribution of astigmatism values, as indicated by the dashed line L10, which is optimized for a left sub-field, edges of which left sub-field is marked by black lines LSF and extends from about −13 mm to about 0 mm on the slit-x-axis. Astigmatism values outside (i.e. to the right of) the optimized sub-field are higher than in a distribution optimized for the entire exposure field, which is indicated by the solid black line L11. In FIG. 7, a distribution of coma values is shown. A distribution of coma values has been optimized with respect to the right sub-field, edges of which are marked by black lines denoted "RSF", as evident from the distribution as indicated by the dashed lines as compared to the solid black line which represents a distribution optimized for the entire exposure field.

Figure 8:
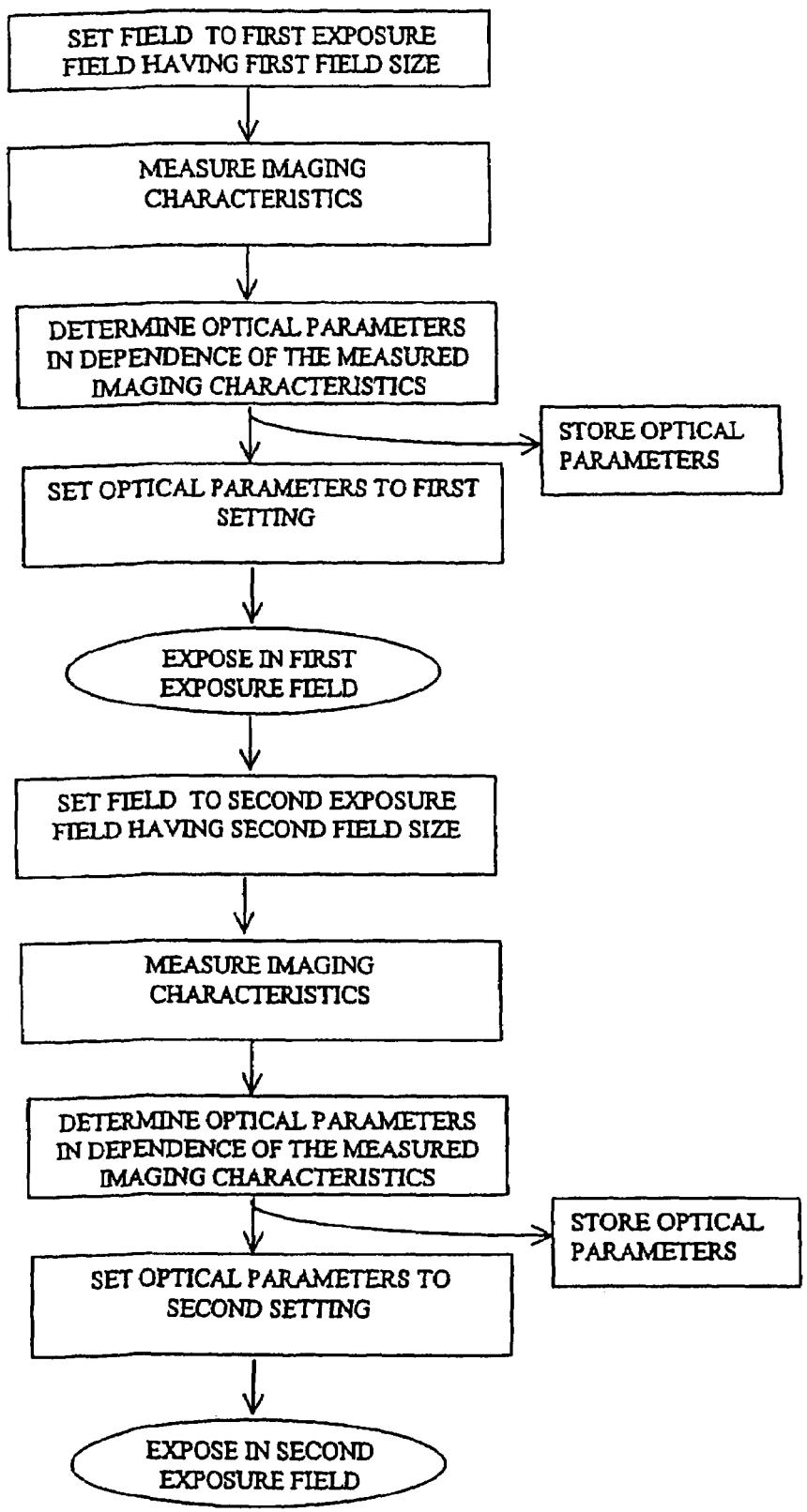
FIG. 8 shows a flow diagram of a sixth embodiment of the present invention.

In FIG. 8, a flow diagram illustrates a sixth embodiment of the present invention. In a first step, the field (of a substrate/in the substrate-plane) is set to a first exposure field having a first field size. This may be accomplished by setting a reticle masking system of the illumination optical system to a desired size. In a second step, imaging characteristics are measured by shearing interferometry as described in US 2002/0001088 A1, the entire contents of which is incorporated by reference herein. In brief, a light beam generated by the illumination system is incident on a reticle containing a coherence mask situated in the reticle-plane (object-plane) of the projection optical system. The coherence mask acts as wavefront source for the shearing interferometer. The wavefront is imaged by the projection optical system onto a diffraction grating situated in the substrate-plane (image-plane) of the projection optical system. The diffraction grating splits the wavefront into several sheared diffraction orders which superpose and form interferograms which are recorded by a detector. Interferograms of these sheared wavefronts are used to reconstruct the wavefront containing the aberrations of the projection optical system. In dependence of the measured imaging characteristics, optical parameters are determined in a third step. The optical parameters providing an optimized imaging performance for the first field size constitute the first setting. The optical parameters providing optimized imaging performance for the first field size are stored in a look-up table from which they may be retrieved at a later stage which renders an additional measurement step unnecessary when, after exposure in an exposure field having a field size different from the first field size, the field size is set back to the first field size. Once the optical parameters are set to the first setting, the projection exposure system is used to carry out projection exposure in the first exposure field. If, for instance, the projection exposure system is used for a different application employing a patterning structure necessitating a different illuminated region and thus different exposure field size, the field is set to a second exposure field having the second field size. In a subsequent step, imaging characteristics are measured by shearing interferometry, as described above. In dependence of these imaging characteristics, optical parameters are determined for the second field size. The optical parameters providing an optimized imaging performance for the second field size constitute the second setting. The optical parameters are then set to the second setting which provides better imaging performance. Again, the optical parameters of the second setting may be stored for later use.

Figure 9:
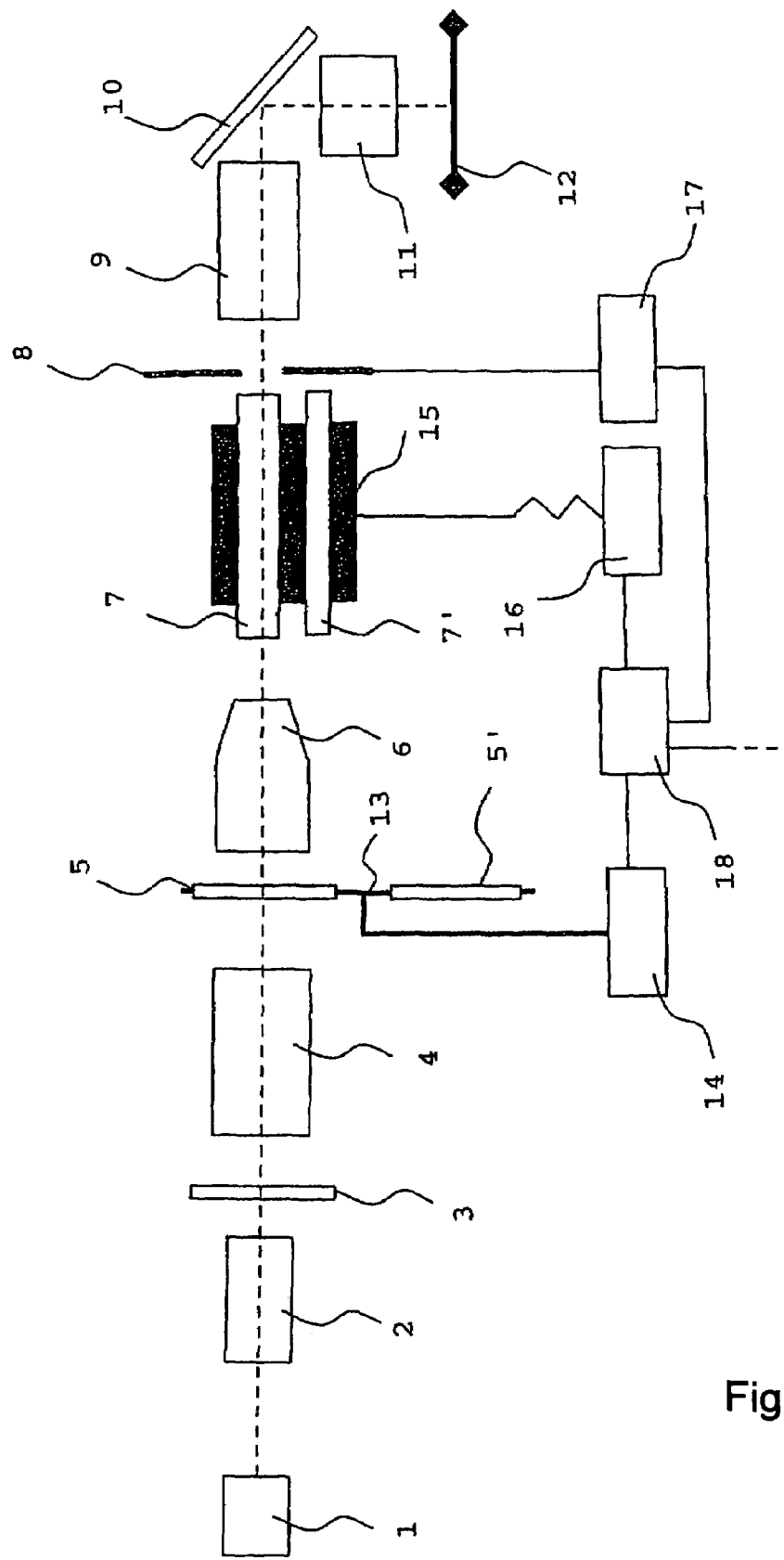
FIG. 9 shows an illumination optical system of a preferred embodiment of a projection exposure system according to the fourth aspect of the present invention.

According to a preferred embodiment of the projection exposure system of the present invention according to a fourth aspect, which is depicted in FIG. 9, an illumination system comprises an exchangeable optical integrator system comprising a glass rod and a diffractive optical element which may be exchanged when changing a field size in order to improve an illumination efficiency. The beam delivery system according to the third embodiment of the present invention is substantially the one described in U.S. Pat. No. 6,285,443 and comprises, in the direction of the beam traveling through the beam delivery system: a light source 1, a beam expander 2, a first diffractive optical element 3, an objective 4, a second diffractive optical element 5, an in-coupling optic 6, a glass rod 7, a reticle masking system 8, and an additional objective comprising several lens elements 9,10 and a mirror 11 before the reticle plane 12. The beam expander 2 magnifies and reduces coherence of a laser beam cross-section generated by the laser light source 1. The first diffractive optical element 3 defines an object plane having an exit pupil in which the second diffractive optical element 5 is provided. The objective 4 in between the two diffractive optical elements 3, 5 may be a zoom element. The in-coupling optic 6 transfers light exiting from the second diffractive optical element 5 to an entry face of the glass rod 7 which serves to mix and homogenize the light. The reticle masking system 8 is positioned in an intermediate field plane directly at an exit face of the glass rod 7, with the reticle masking system 8 defining an adjustable field diaphragm. The objective 9 to 11 then images the intermediate field plane of the reticle masking system 8 onto the reticle 12. When changing a field size to a smaller field size, i.e. when a region to be illuminated on the reticle is changed to a smaller region, the optical integrator system comprising glass rod 7 and the second diffractive optical element (DOE) 5 are exchanged for a glass rod 7' of a different size and a second DOE 5' adapted to precisely shape the light beam in dependence of a size and shape of an entry face of glass rod 7'. Thus, an illumination efficiency is increased. Glass rods 7 and 7' are mounted on a slidable carriage 15 which is adapted to move glass rod 7 or 7' into the path of the light beam. Carriage 15 is controlled by carriage control unit 16 which receives a command from central control unit 18 to slide the carriage in a first position with glass rod 7 in the beam path or a second position with glass rod 7' into the beam path. When the glass rod is changed from glass rod 7 to glass rod 7', the second DOE is changed from DOE 5 to DOE 5'. The DOEs are mounted on a turret plate 13 which is rotated and controlled by turret plate control unit 14 which receives the command to exchange DOEs from the central control unit 18. The reticle masking system 8 may be adjusted in response to glass rod and second DOE being exchanged. The adjustable aperture formed by the reticle masking system is controlled by reticle masking system control unit 17 which also receives commands from central control unit 18. The central control unit 18 is also linked with a user-interface and other control units which control manipulators, measuring systems and so on. Instead of the described DOEs 3 and 5, 5' also refractive microlens arrays or other diffusers producing the desired angular spectrum can be used.

Figure 10:
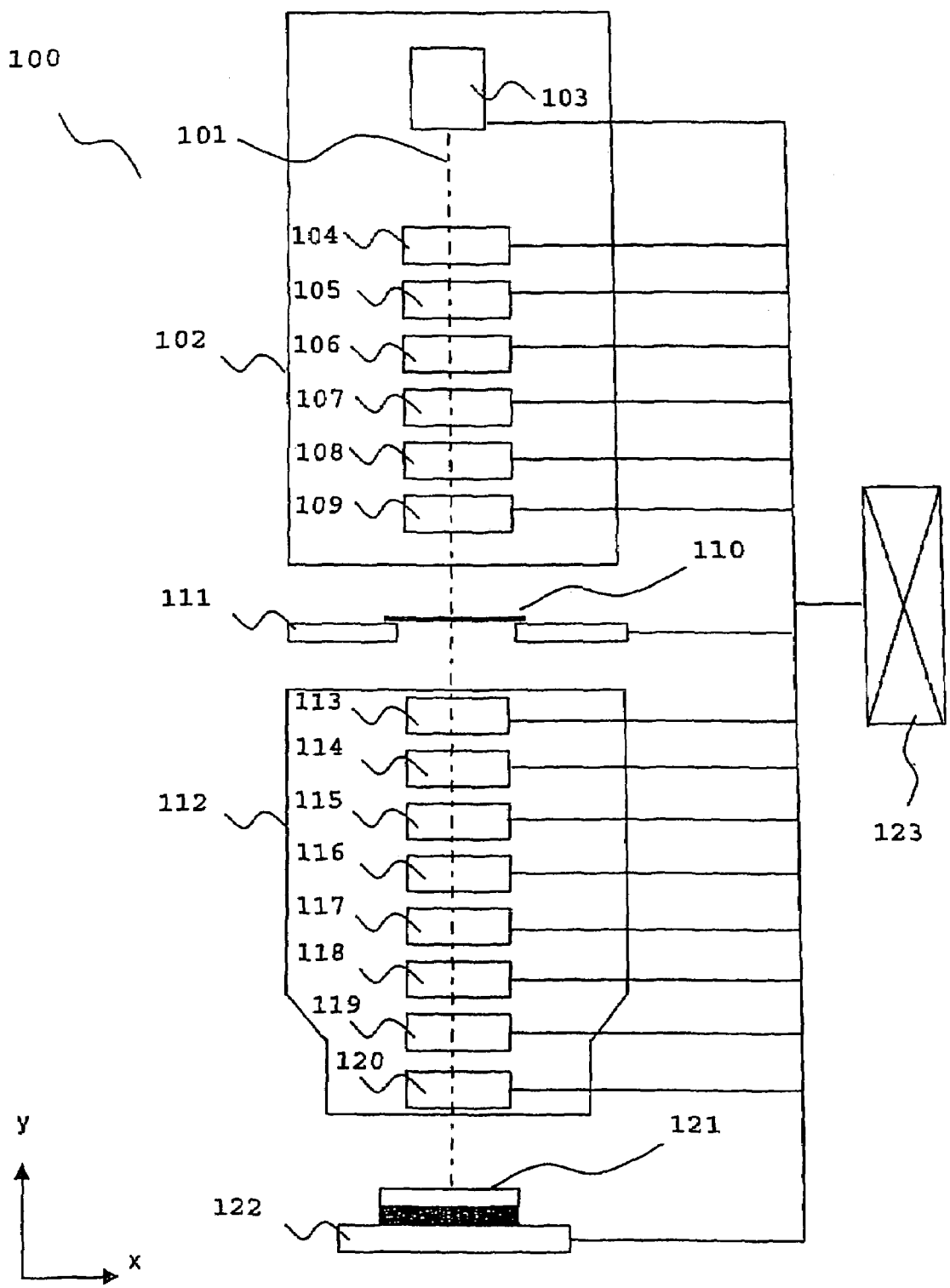
FIG. 10 shows an embodiment of a projection exposure system adapted to carry out the method of the present invention.

In FIG. 10, a schematic representation of a projection exposure system 100 adapted for use with the methods according to the present invention is given. Projection exposure system 100 has an optical axis 101 and comprises illumination optical system 102 and projection optical system 112. Illumination optical system 102 comprises a light source 103 for emitting a beam of light of a predetermined wavelength or range of wavelengths and/or polarization, which is a laser light source in this embodiment of the present invention. The illumination system further comprises a number of components 104 to 109.

Component 104, in this embodiment, is a wavelength selection system which allows to set a predetermined wavelength of the illumination light. Whilst in this exemplary embodiment, component 104 is a separate wavelength selection system, in other embodiments of the present invention, component 104 may be an integral part of light source 103, which is usually the case in modern types of lasers which allow selection of a wavelength of light in the beam emitted by the laser. Component 105 allows to select an illumination mode of the illumination optical system, i.e. selection of one of circular, annular, off-axis, dipole, quadrupole and the like. Component 106 is an zoom objective which allows to change a numerical aperture of the projection optical system. Component 107 is a system for exchanging an optical integration system for exchanging a glass rod and a second DOE as illustrated in FIG. 9. Component 108 is a reticle masking system for defining—in combination or as an alternative to the optical integration system—an illuminated region on the reticle. Component 109 is a compensator, such as a tiltable mirror or wedge-like transmissive optical element for compensating for telecentricity errors of the illumination optical system 102. The optical characteristics of components 104, 106 to 109 may be adjusted in order to optimize imaging characteristics and, hence, an imaging performance, when a field size is changed from a first field size to a second field size. Component 105, which sets the illumination mode, may be selected in accordance with a particular reticle pattern. Optical parameters of components 104, 106 to 109 may be adjusted to provide optimum imaging characteristics for both the field size and the illumination mode. The light beam, the shape, intensity and uniformity of which has been adjusted by the illumination optical system 102 is incident on reticle 110 which is placed on a reticle holder 111. Reticle holder 111 allows fine movement in directions parallel (y) or perpendicular (x) to the optical axis 101 as well as a tilt relative to the optical axis 101. An image of the pattern of the illuminated region of reticle 110 is then transferred through the projection optical system 112 and projected onto a substrate 121 coated with a layer which is sensitive to the wavelength of the light used for exposure. Substrate 121 is placed on a substrate holder 122, which, in a manner similar to that of reticle holder, allows fine movement in directions parallel (y) or perpendicular (x) to the optical axis 101 as well as a tilt relative to the optical axis 101. Movement along the optical axis 101, for instance, allows to adapt to changed focus conditions. The projection optical system comprises a number of components 113 to 120 the optical characteristics of which can be adjusted so as to adapt the imaging characteristics of the projection optical system 112 and optimize an imaging performance for a particular field size.

Although components 113 to 120 are depicted in series, this particular arrangement is merely schematic and not to be construed as the order of these components. The order generally varies in dependence of the particular design of the projection optical system and other factors. The following is a list of components or optical elements, respectively, that may be comprised in a projection optical system and allow adjustment of optical parameters to optimize an imaging performance. Component 120, in this particular embodiment, is an adjustable aperture, which may be adjusted to change a numerical aperture of the projection optical system 112. Component 119 is a gas delivery and control system which controls gas pressure and thus transmission and/or refractive index in one or more sealed spaces in between optical elements to be controlled. Components 118 and 117 are lenses that are movable perpendicularly to the optical axis and/or tiltable with respect to the optical axis. Component 116 is a deformable optical element which may be used to correct for aberrations. Components 115 and 114 are lenses adapted to be rotatable about the optical axis. In this particular embodiment, lenses 115 and 114 are made of calcium fluoride which has an intrinsic birefringence. In order to compensate for polarization of light passing through lenses 114 and 115 they may rotated with respect to each other in dependence of an angle between the optical axis 101 and the particular crystal axis of the lenses, which is known as "clocking". Component 113 is a lens group wherein the distance between one or more lenses in the lens group can be changed so as to compensate for errors such as coma, astigmatism and distortion of the projection optical system 112. All components of both the illumination optical system 102 and the projection optical system 112 each comprise their individual drive and control mechanisms, which are, for sake of simplicity, not depicted. The components' drive and control mechanism are each individually controlled by central control unit 123. The central control unit 123 supplies commands in dependence of the particular field size used.

While the invention has been described also with respect to exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as given by the following claims and equivalents thereof.

What is claimed is:

1. A projection exposure system comprising an illumination optical system having a pupil plane and including a light source for illuminating a patterning structure and a projection optical system for imaging a region of the illuminated patterning structure into a corresponding field in a substrate-plane for exposing substrates with images of the patterning structure in a manufacturing process of miniaturized articles formed from the exposed substrates,
   wherein the illumination optical system comprises:
      a first optical integrator system for illuminating a first region of a first size of the patterning structure; and
      at least a second optical integrator system for illuminating a second region of the patterning structure which has a second size which is different from the first size, wherein the first and at least second optical integrator are arranged such that the first optical integrator can be exchanged for the at least second optical integrator system;
   wherein a distribution of illumination intensity in a pupil plane of the illumination optical system in terms of shape and size is substantially the same for the first and at least second optical integrator system.

2. The projection exposure system of claim 1, wherein the first and at least second optical integrator system each comprise a diffractive or refractive optical raster element.

3. The projection exposure system of claim 2, wherein the first and at least second optical integrator system further each comprise a glass rod.

4. The projection exposure system of claim 1, wherein the first and at least second optical integrator system each comprise a fly's eye condenser.

* * * * *